(12) United States Patent
Huitema et al.

(10) Patent No.: US 10,665,578 B2
(45) Date of Patent: May 26, 2020

(54) DISPLAY WITH EMBEDDED PIXEL DRIVER CHIPS

(71) Applicant: Apple Inc., Cupertino, CA (US)

(72) Inventors: Edzer Huitema, Belmont, CA (US); Vaibhav Patel, San Jose, CA (US); Tore Nauta, Santa Cruz, CA (US); Xia Li, San Jose, CA (US); Hsin-Hua Hu, Los Altos, CA (US)

( * ) Notice: Subject to any disclaimer, the term of this patent is extended or adjusted under 35 U.S.C. 154(b) by 0 days.

(21) Appl. No.: 15/908,478

(22) Filed: Feb. 28, 2018

(65) Prior Publication Data

US 2019/0096864 A1 Mar. 28, 2019

Related U.S. Application Data

(63) Continuation-in-part of application No. 15/247,249, filed on Aug. 25, 2016, now Pat. No. 10,483,253.
(Continued)

(51) Int. Cl.
*H01L 21/78* (2006.01)
*H01L 25/16* (2006.01)
(Continued)

(52) U.S. Cl.
CPC .......... *H01L 25/167* (2013.01); *H01L 21/561* (2013.01); *H01L 21/6835* (2013.01); *H01L 24/24* (2013.01); *H01L 24/25* (2013.01); *H01L 24/82* (2013.01); *H01L 33/62* (2013.01); H01L 25/0753 (2013.01); H01L 2221/6834 (2013.01); H01L 2221/68327 (2013.01); H01L 2221/68359 (2013.01); H01L 2221/68372 (2013.01); H01L 2224/24137 (2013.01); H01L 2224/24146 (2013.01); H01L 2224/2518 (2013.01); H01L 2224/25171 (2013.01); H01L 2224/73267 (2013.01); H01L 2224/821 (2013.01); H01L 2924/12041 (2013.01); H01L 2924/1426 (2013.01)

(58) Field of Classification Search
CPC ..... H01L 25/50; H01L 25/0657; H01L 21/78; H01L 21/565
See application file for complete search history.

(56) References Cited

U.S. PATENT DOCUMENTS 7,999,454 B2 8/2011 Winters et al.
8,780,023 B2 7/2014 Ootorii
(Continued)

OTHER PUBLICATIONS

Hamer, John W. et al., 63.2: AMOLED Displays using Transfer-Printed Integrated Circuits, SID 09 Digest, 4 pages, 2009, ISSN/009-0966X/09/3902-0947.

(Continued)

*Primary Examiner* — Kyoung Lee
*Assistant Examiner* — Christina A Sylvia
(74) *Attorney, Agent, or Firm* — Jaffrey Watson Mendonsa & Hamilton LLP

(57) ABSTRACT

Embodiments describe a display integration scheme in which an array of pixel driver chips embedded front side up in an insulator layer. A front side redistribution layer (RDL) spans across and is in electrical connection with the front sides of the array of pixel driver chips, and an array of light emitting diodes (LEDs) is bonded to the front side RDL. The pixel driver chips may be located directly beneath the display area of the display panel.

10 Claims, 32 Drawing Sheets

Related U.S. Application Data

(60) Provisional application No. 62/232,281, filed on Sep. 24, 2015.

(51) Int. Cl.
*H01L 23/00* (2006.01)
*H01L 33/62* (2010.01)
*H01L 21/56* (2006.01)
*H01L 21/683* (2006.01)
*H01L 25/075* (2006.01)

(56) References Cited

U.S. PATENT DOCUMENTS

| | | |
|---|---|---|
| 2003/0025657 A1* | 2/2003 | Iwafuchi .............. H01L 25/167 345/82 |
| 2006/0158804 A1 | 7/2006 | Usui |
| 2006/0192915 A1 | 8/2006 | Kimura |
| 2007/0052344 A1* | 3/2007 | Wen .................... G02F 1/13452 313/498 |
| 2010/0039030 A1 | 2/2010 | Winters et al. |
| 2012/0206499 A1 | 8/2012 | Cok |
| 2014/0110728 A1 | 4/2014 | Lee et al. |
| 2014/0159064 A1 | 6/2014 | Sakariya et al. |
| 2015/0169011 A1 | 6/2015 | Bibl et al. |
| 2015/0206861 A1 | 7/2015 | Dubin |
| 2016/0163765 A1 | 6/2016 | Hu |

OTHER PUBLICATIONS

Cok, Ronald S. et al., 60.3: AMOLED Displays using Transfer-Printed Integrated Circuits, SID 10 Digest, 4 pages, 2010, ISSN/0097-0966X/10/4102-0902.

International Search Report and Written Opinion for PCT/US2019/019273, dated Jun. 27, 2019, 13 pgs.

* cited by examiner

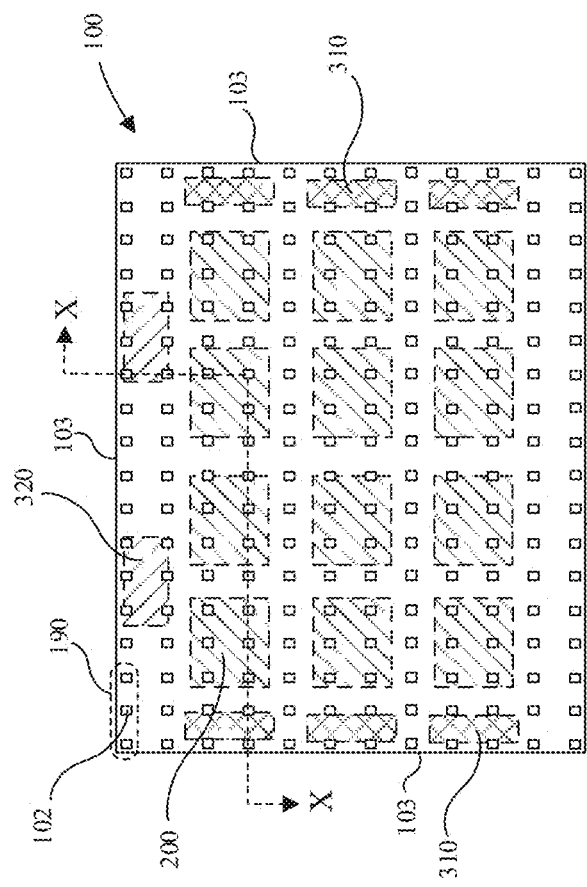
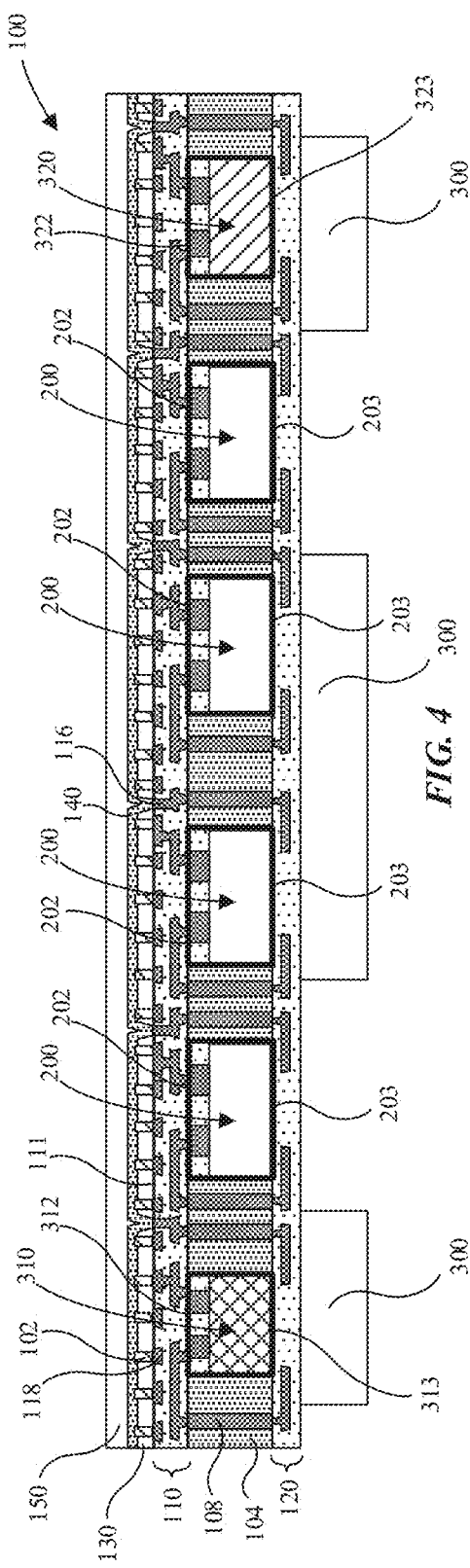
FIG. 3
FIG. 4

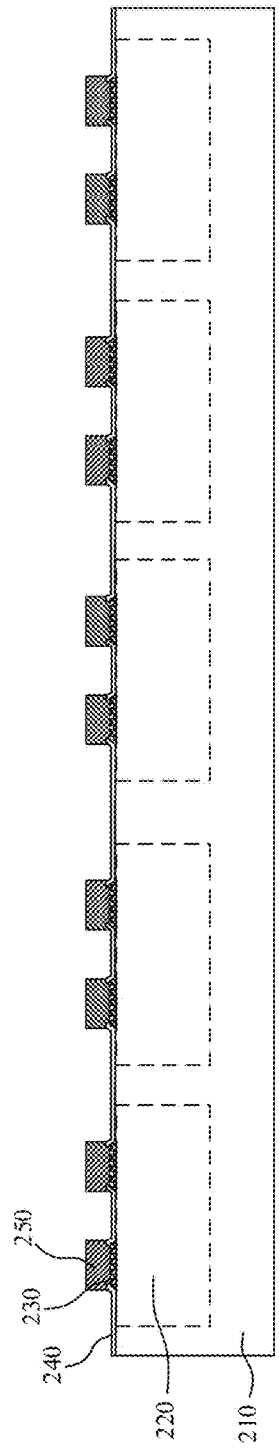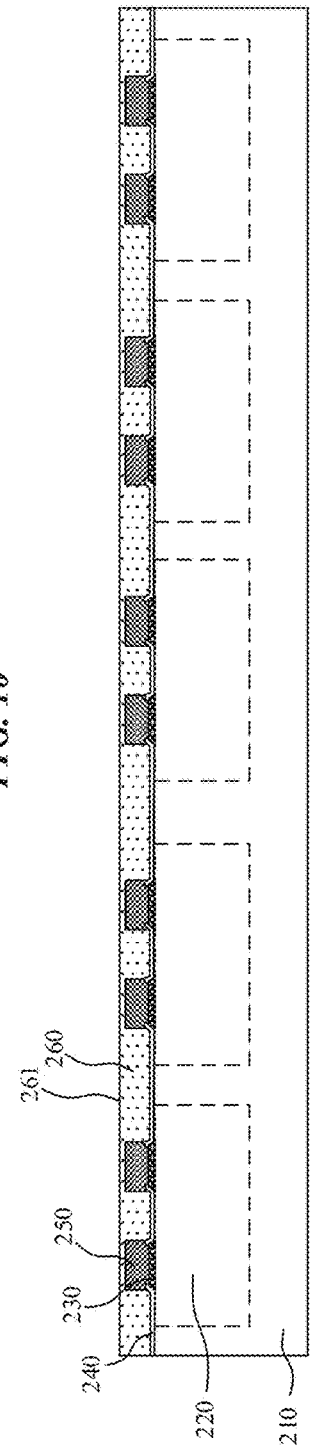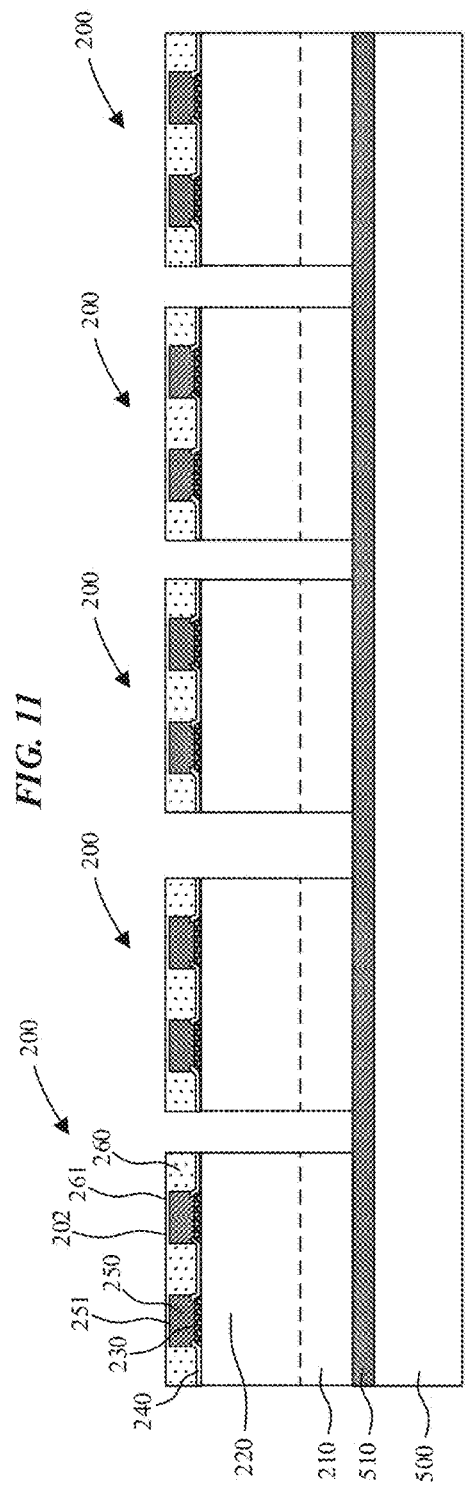

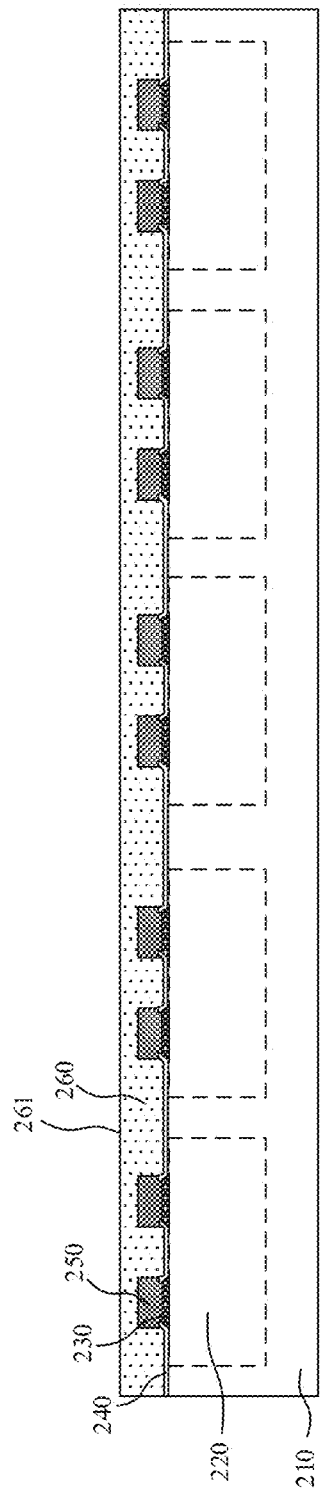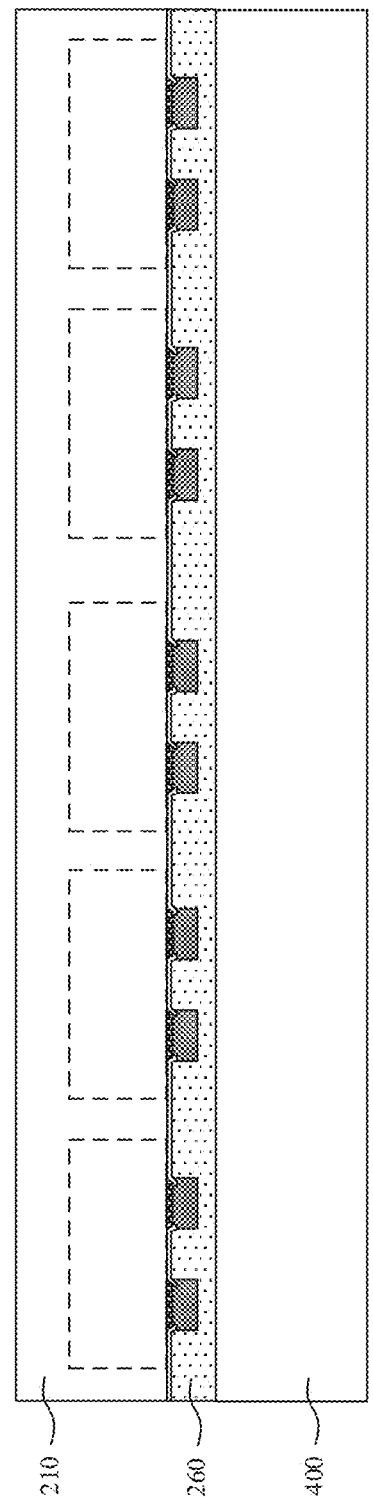

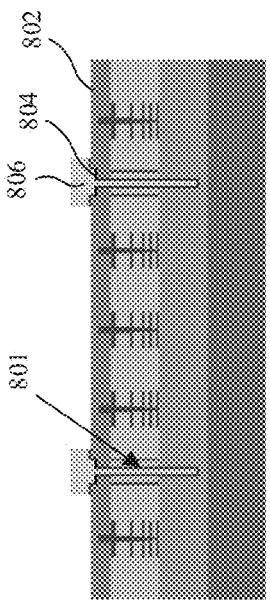
FIG. 41
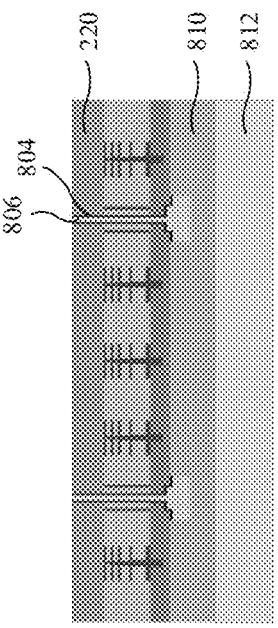
FIG. 43
FIG. 40
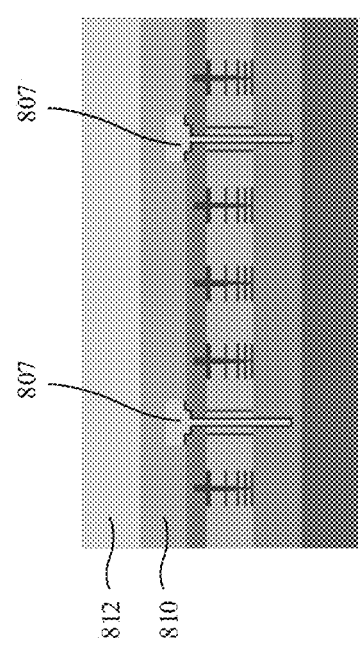
FIG. 42

Tolerance $t = (p - 2 \cdot e - v) / 2$

DISPLAY WITH EMBEDDED PIXEL DRIVER CHIPS

RELATED APPLICATIONS

This application is a continuation-in-part of co-pending U.S. patent application Ser. No. 15/247,249 filed Aug. 25, 2016, which claims the benefit of priority of U.S. Provisional Application No. 62/232,281 filed Sep. 24, 2015, both of which are incorporated herein by reference.

BACKGROUND

Field

Embodiments described herein relate to display panels. More particularly, embodiments relate to high resolution display panels.

Background Information

Flat panel display panels are gaining popularity in a wide range of electronic devices ranging from mobile electronics, to televisions and large outdoor signage displays. Demand is increasing for higher resolution displays, as well as for thinner, lighter weight, and lower cost electronic devices with larger screens.

Conventional organic light emitting diode (OLED) or liquid crystal display (LCD) technologies feature a thin film transistor (TFT) substrate. More recently, it has been proposed to replace the TFT substrate with a matrix of microcontrollers bonded to the substrate and build a micro light emitting diode (LEDs) display by integrating a matrix of micro LEDs on the microcontroller substrate, in which each microcontroller is to switch and drive one or more micro LEDs.

SUMMARY

Embodiments describe a display integration scheme in which pixel driver chips are embedded face up in a display substrate. A front side redistribution layer (RDL) is formed over the pixel driver chips and insulator layer forming the display substrate, and the LEDs are placed on the front side RDL layer. This integration scheme may allow for significant freedom in designing and locating the pixel driver chips, which can be virtually any size. Conductive pillars can be formed through the insulating layer for connecting to chips that can be placed on a back side of the display substrate (e.g., power management IC, timing controller, processor, memory, etc.).

BRIEF DESCRIPTION OF THE DRAWINGS

FIG. 3 is a schematic top view illustration of a display panel including an array of LEDs arranged over a plurality of embedded pixel driver chips, row driver chips, and column driver chips in accordance with an embodiment.

FIG. 4 is a schematic cross-sectional side view illustration of a display panel taken along line X-X of FIG. 3 in accordance with an embodiment.

FIG. 10 is a schematic cross-sectional side view illustration of conductive bumps on a device substrate in accordance with an embodiment.

FIG. 11 is a schematic cross-sectional side view illustration of a planarization layer formed over conductive bumps on a device substrate in accordance with an embodiment.

FIG. 12 is a schematic cross-sectional side view illustration of singulated pixel driver chips in accordance with an embodiment.

FIG. 14 is a schematic cross-sectional side view illustration of a planarization layer formed over conductive bumps on a device substrate in accordance with an embodiment.

FIG. 15 is a schematic cross-sectional side view illustration of a device substrate attached to a carrier substrate in accordance with an embodiment.

FIG. 40 is a schematic cross-sectional side view illustration of a device wafer and build-up structure in accordance with an embodiment.

FIG. 41 is a schematic cross-sectional side view illustration of the formation of a metal contact layer and sacrificial oxide trench fill in a device wafer accordance with an embodiment.

FIG. 42 is a schematic cross-sectional side view illustration of a patterned device wafer bonded to a carrier substrate in accordance with an embodiment.

FIG. 43 is a schematic cross-sectional side view illustration of a thinned device wafer on carrier substrate in accordance with an embodiment.

DETAILED DESCRIPTION

Figure 1:
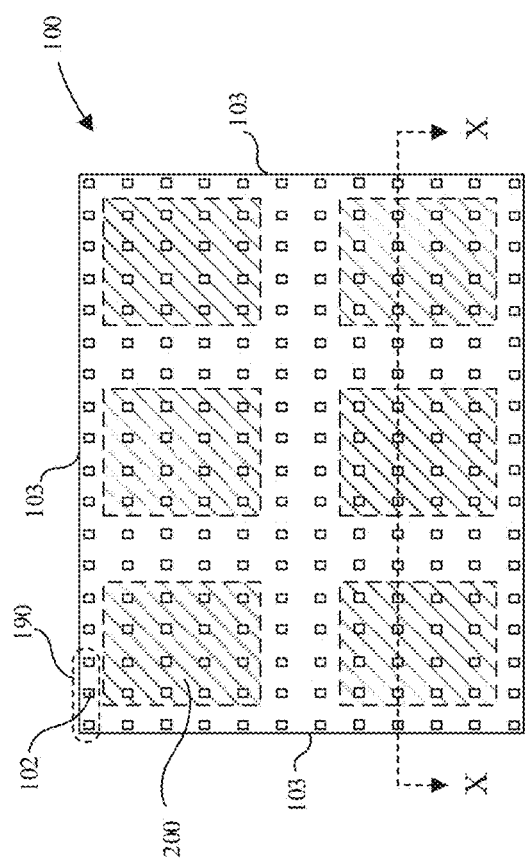
FIG. 1 is a schematic top view illustration of a display panel including an array of LEDs arranged over a plurality of embedded pixel driver chips in accordance with an embodiment.

Embodiments describe display panel configurations and methods of manufacture. In an embodiment, a display panel includes an array of pixel driver chips embedded front side up in an insulator layer, a front side redistribution layer (RDL) spanning across and in electrical connection with the front sides of the array of pixel driver chips, and an array of light emitting diodes (LEDs) bonded to the front side RDL. The array of LEDs may be arranged in an array of pixels, in which each pixel driver chip is to switch and drive a plurality of LEDs in the array of LEDs for a plurality of pixels.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "above", "over", "to", "between", "spanning", and "on" as used herein may refer to a relative position of one layer with respect to other layers. One layer "above", "over", "spanning", or "on" another layer or bonded "to" or in "contact" with another layer may be directly in contact with the other layer or may have one or more intervening layers. One layer "between" layers may be directly in contact with the layers or may have one or more intervening layers.

In one aspect, embodiments describe display panel configurations that are compatible with high resolution displays. In accordance with embodiments, pixel driver chips for driving and switching the LEDs are embedded within the display substrate and electrically connected with the LEDs through a front side RDL. In such a configuration, size of the pixel driver chips is not limited by the pitch between LEDs. In this aspect, larger pixel driver chips with more functionality can potentially be integrated into the display panel. For an exemplary RGB display panel (pixels including a red-emitting, green-emitting, and blue-emitting LED) with 40 PPI (pixels per inch) may have an approximately 211 μm subpixel pitch, whereas an exemplary RGB display panel with 440 PPI may have an approximately 19 μm subpixel pitch. In accordance with embodiments, rather than locating the pixel driver chips between the LEDs on the display panel, the pixel driver chips are embedded within the display substrate allowing scalability of the display panel to high resolution display with high PPI. In accordance with embodiments, the pixel driver chips may be located directly beneath the LEDs and directly beneath the display area of the display panel.

In an embodiment, an LED may be an inorganic semiconductor-based material having a maximum lateral dimension of 1 to 300 μm, 1 to 100 μm, 1 to 20 μm, or more specifically 1 to 10 μm, such as 5 μm. In an embodiment a pixel driver may be in the form of a chip. In accordance with embodiments, the pixel driver chips can replace the switch(s) and storage device(s) for each display element as commonly employed in a TFT architecture. The pixel driver chips may include digital unit cells, analog unit cells, or hybrid digital and analog unit cells. Additionally, MOSFET processing techniques may be used for fabrication of the pixel driver chips on single crystalline silicon as opposed to TFT processing techniques on amorphous silicon (a-Si) or low temperature polysilicon (LTPS).

In one aspect, significant efficiencies may be realized over TFT integration techniques. For example, pixel driver chips may utilize less real estate of a display substrate than TFT technology. For example, pixel driver chips incorporating a digital unit cell can use a digital storage element (e.g., register) which consumes comparatively less area that an analog storage capacitor. Where the pixel driver chips include analog components, MOSFET processing techniques on single crystalline silicon can replace thin film techniques that form larger devices with lower efficiency on amorphous silicon (a-Si) or low temperature polysilicon (LTPS). Pixel driver chips may additionally require less power than TFTs formed using a-Si or LTPS. In addition, embodiments allow for the integration of known good pixel driver chips.

In another aspect, embodiments describe display panel configurations with an increased allocation for display area on the display panel. Conventional chip on glass (COG) packaging may require a driver ledge and/or contact ledge of at least 4-5 mm for allocation of driver IC chips and a flexible printed circuit (FPC) contact area. In accordance with embodiments, driver ledges and/or contact ledges may be removed from the front surface of the display panel. In an embodiment, row driver chips or column driver chips may be embedded within the display substrate along with the pixel driver chips, or bonded to a back side of the display panel. In an embodiment, conductive pillars provide electrical connection between the front side RDL and device chips (e.g., timing controller chip, power management IC, processor, touch sense IC, wireless controller, communications IC, etc.) bonded to a back side RDL.

In yet another aspect, embodiments describe display panel configurations of flexible display panels. For example, the display panels may be curved, rollable, foldable, or otherwise flexible. In other aspect, embodiments describe display panel configurations with increased display area. For example, multiple display panels may be arranged as tiles side-by side.

Figure 2:
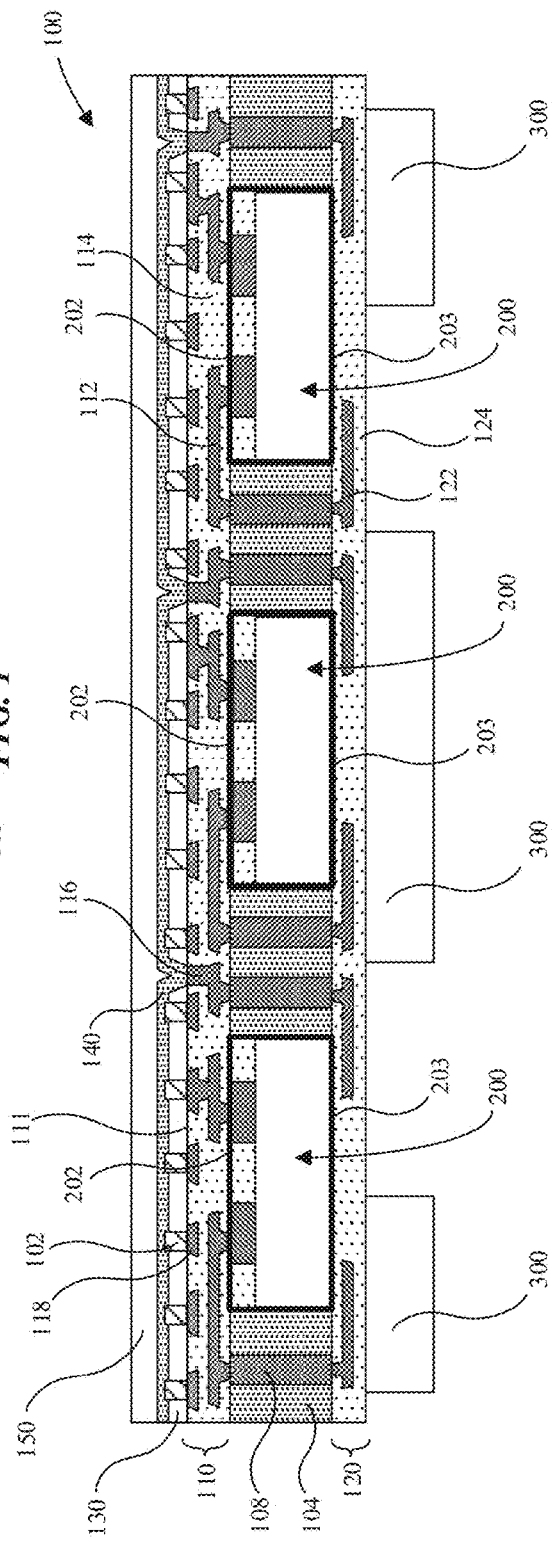
FIG. 2 is a schematic cross-sectional side view illustration of a display panel taken along line X-X of FIG. 1 in accordance with an embodiment.

Referring now to FIG. 1 a schematic top view illustration is provided of a display panel 100 including array of LEDs 102 arranged over a plurality of embedded pixel driver chips 200 in accordance with an embodiment. FIG. 2 is a schematic cross-sectional side view illustration of a display panel 100 taken along line X-X of FIG. 1 in accordance with an embodiment. Referring to both FIG. 1 and FIG. 2, a fine bevel edge widths, or distance between an outermost LED 102 and display panel edge 103, are possible in accordance with embodiments. In such a configuration, the proportion of display area for a display panel can be increased, particularly compared to conventional COG packaging technologies. However, it is to be appreciated that while such configurations may be possible, embodiments do not require such.

In an embodiment, an array of pixel driver chips 200 is embedded front side 202 up in an insulator layer 104. A front side redistribution layer (RDL) 110 spans across and is in electrical connection with the front sides 202 of the array of pixel driver chips 200. An array of LEDs 102 is bonded to the front side RDL 110, the array of LEDs 102 is arranged in an array of pixels 190. Each pixel 190 may include multiple subpixels that emit different colors of lights. In a red-green-blue (RGB) subpixel arrangement, each pixel may include three subpixels that emit red light, green light, and blue light, respectively. It is to be appreciated that the RGB arrangement is exemplary and that this disclosure is not so limited. Examples of other subpixel arrangements that can be utilized include, but are not limited to, red-green-blue-yellow (RGBY), red-green-blue-yellow-cyan (RGBYC), or red-green-blue-white (RGBW), or other subpixel matrix schemes where the pixels may have different number of subpixels.

In accordance with embodiments, each pixel driver chip 200 may switch and drive a plurality of LEDs 102 in the array of LEDs for a plurality of pixels 190. The display panels 100 in accordance with embodiments may include digital components, analog components, or a combination of both. For example, each pixel driver chip 200 may include an analog driving circuit, a digital driving circuit, or a driving circuit combining both analog and digital components. In an embodiment, the pixel driver chips each have a minimum x-y dimension that that is larger than a maximum pitch in the x-y dimensions between adjacent LEDs.

Referring to FIG. 2, each of the LEDs 102 may be bonded to a respective contact pad 118 on a front side 111 of the front side RDL 110. A sidewall passivation layer 130 may laterally surround the LEDs 102. Sidewall passivation layer 130 may be formed of an electrically insulating material, and may be transparent or opaque. One or more top conductive contact layers 140 may then be formed over one or more, or all of the LEDs 102. In an embodiment, top conductive contact layer 140 is transparent. For example, top conductive contact layer 140 may be formed of a transparent conductive oxide such as indium-tin oxide (ITO), or a transparent conductive polymer such as poly(3,4-ethylenedioxythiophene) (PEDOT). In an embodiment, top conductive contact layer 140 is additionally formed on an in electrical contact with a $V_{SS}$ or ground line 116. A top encapsulation layer 150 may then be formed over the top conductive contact layer 140. Top encapsulation layer 150 may be formed of a transparent material.

In accordance with embodiments, a back side RDL 120 optionally spans across the insulator layer 104 and back sides 203 of the array of pixel driver chips 200. Additionally, a plurality of conductive pillars 108 may optionally extend through the insulator layer 104 from the back side RDL 120 to the front side RDL 110. While a back side RDL 120 and conductive pillars 108 are not required in accordance with embodiments, such a configuration can be used to increase the available display area on the front side of the substrate by providing routing to the back side of the display panel 100 as opposed to edges 103 of the display panel. In accordance with embodiments, one or more device chips 300 may be mounted on the back side RDL 120 and in electrical connection with the plurality of conductive pillars 108. For example, device chips 300 may include a power management IC, timing controller, touch sense IC, wireless controller, communications IC, processor, memory, etc.

In accordance with embodiments, the display panels 100 may include one or more row driver chips and/or column driver chips. In the embodiments illustrated in FIGS. 1-2, one or more row driver chips and/or column driver chips may be included among the device chips 300. In other embodiments, one or more row driver chips and column driver chips may be embedded front side up within the insulator layer 104, or mounted on (e.g., bonded to) the front side 111 of the front side RDL 110.

Referring now to FIG. 3 a schematic top view illustration is provided of a display panel 100 including an array of LEDs 102 arranged over a plurality of embedded pixel driver chips 200, row driver chips 310, and column driver chips 320 in accordance with an embodiment. FIG. 4 is a schematic cross-sectional side view illustration of a display panel taken along line X-X of FIG. 3 in accordance with an embodiment. FIGS. 3-4 are similar to FIGS. 1-2 in that the display areas of the display panels 100 are not constrained by a requirement to surface mount chips on the same side of the display panel as the display area. Thus, display area can be increased by embedding row driver chips 310 and column driver chips 320 underneath the display area along with the pixel driver chips 200. In the embodiments illustrated in FIGS. 3-4, the row driver chips 310 are embedded front side 312 up in the insulator layer 104, and column driver chips 320 are embedded front side 322 up in the insulator layer 104. The front side RDL 110 spans across and is in electrical connection with the front sides 202 of the array of pixel driver chips 200, and front sides 312 of the plurality of row driver chips 310, and front sides 322 of the plurality of column driver chips 320. In an embodiment, a back side RDL 120 spans across the insulator layer 104 and the back sides 203 of the array of pixel driver chips 200, back sides 313 of the plurality of row driver chips 310, and back sides 323 of the plurality of column driver chips 320.

Figure 5:
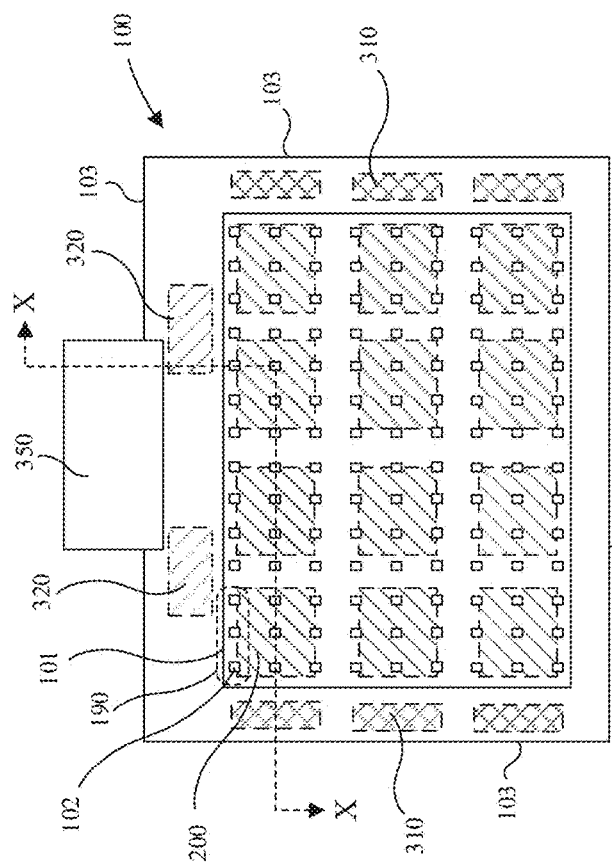
FIG. 5 is a schematic top view illustration of a display panel including an array of LEDs, row driver chips, and column driver chips arranged over a plurality of embedded pixel driver chips in accordance with an embodiment.
Figure 6:
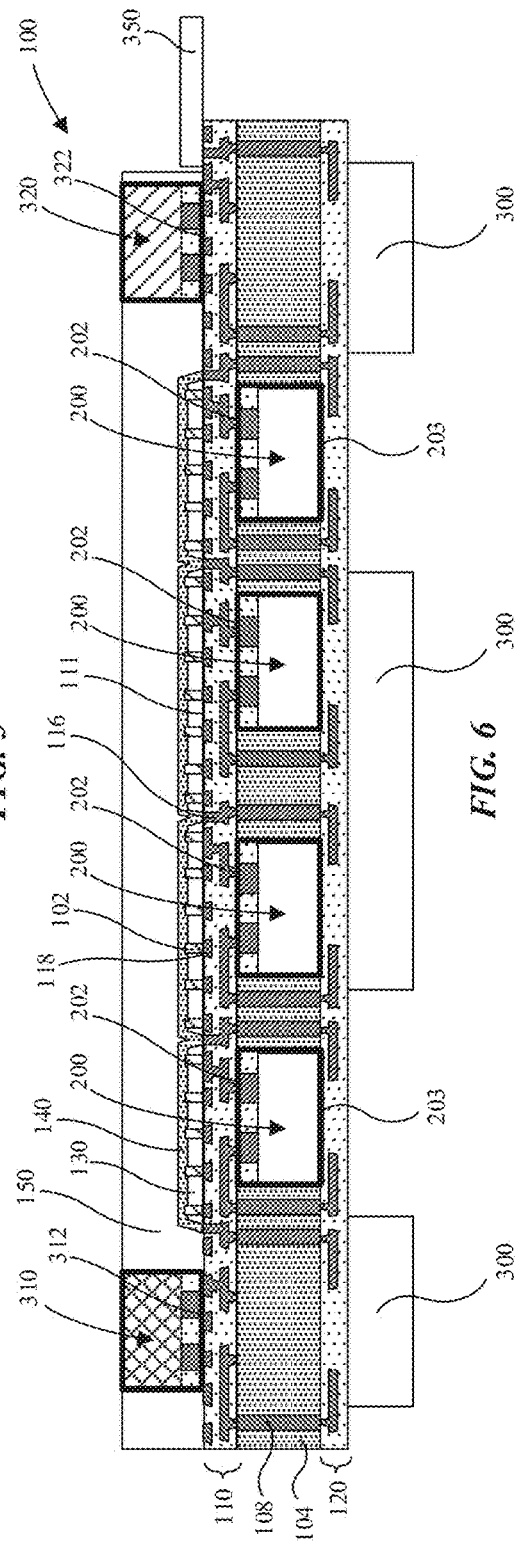
FIG. 6 is a schematic cross-sectional side view illustration of a display panel taken along line X-X of FIG. 5 in accordance with an embodiment.

Referring now to FIG. 5 a schematic top view illustration is provided of a display panel 100 including an array of LEDs 102, row driver chips 310, and column driver chips 320 arranged over a plurality of embedded pixel driver chips 200 and outside of the display area 101 of the display panel 100 in accordance with an embodiment. FIG. 6 is a schematic cross-sectional side view illustration of a display panel taken along line X-X of FIG. 5 in accordance with an embodiment. FIGS. 5-6 are differ from FIGS. 1-2 in that the display areas 101 of the display panels 100 are optionally constrained by location of the row driver chips 310 and/or column driver chips 320. A flex circuit 350 is additionally illustrated in FIG. 5. For example, the flex circuit 350 can be attached to the front side RDL 110 or the back side RDL 120. In the embodiment illustrated the array of pixel driver chips 200 are embedded front side 202 up in the insulator layer 104 directly underneath the display area 101, and the plurality of optional row driver chips 310 are mounted front side 312 down on the front side RDL 110 outside of the display area 101. Pixel driver chips 200 may also be embedded front side 202 up in the insulator layer 104 outside of the display area 101, for example, directly underneath the row driver chips 310 and/or column driver chips 320.

FIGS. 1-6 illustrate a variety of configurations that are possible in accordance with embodiments. While several configurations have been illustrated separately, some may be combined in other embodiments. For example, a flex circuit 350 may be attached to the front side 111 of the front side RDL 110 in any of the embodiments illustrated in FIGS. 1-6 in order to provide an electrical connection to components off of the display panel 100, for example, when optional conductive pillars 108 and back side RDL 120 are not included. A flex circuit 350 may also be attached to the back side RDL 120.

Figure 7:
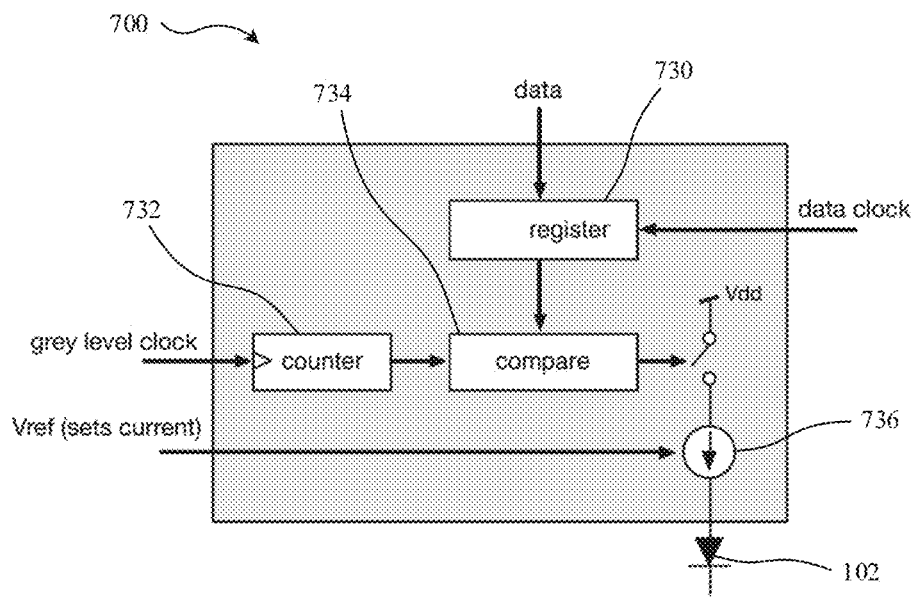
FIG. 7 is an illustration of a digital unit cell of a pixel driver chip in accordance with an embodiment.

FIG. 7 is an illustration of a digital unit cell 700 of a pixel driver chip 200 in accordance with an embodiment. The pixel driver chip 200 may include one or more unit cells 700, and may include one or more components of the unit cells 700. Depicted unit cell 700 includes a register 730 (e.g., digital data storage device) to store a data signal corresponding to the emission to-be-output from the LED 102. Data stored in a register may be referred to as a digital data, e.g., in contrast to analog data stored in a capacitor. Data (e.g., video) signal may be loaded (e.g., stored) into the register 730, for example, by being clocked in according to a data clock. In one embodiment, the data clock signal being active (e.g., goes high) allows data (e.g., from a column driver chip 320) to enter the register and then the data is latched into the register when the data clock signal (e.g., from a row driver chip 310) is inactive (e.g., goes low). A signal (e.g., non-linear) gray scale (e.g., level) clock (e.g., from a row driver chip 310) may increment a counter 732. Gray scale clock may also reset the counter to its original value (e.g., zero).

Unit cell 700 also includes a comparator 734. Comparator may compare a data signal from the register 730 to a number of pulses from a (e.g., non-linear) gray scale clock counted by counter 732 to cause an emission by LED 102 when the data signal differs from (e.g., or is greater or less than) the number of pulses from the non-linear gray scale clock. Depicted comparator may cause a switch to activate a current source 736 to cause the LED 102 to illuminate accordingly. A current source (e.g., adjusted via an input, such as, but not limited to a reference voltage (Vref) may provide current to operate an LED 102. A current source may have its current set by a control signal, such as a bias voltage setting the current, use of a (e.g., Vth) compensation pixel circuit, or adjusting a resistor of a constant current operational amplifier (opamp) to control the output of the opamp's current.

Figure 8:
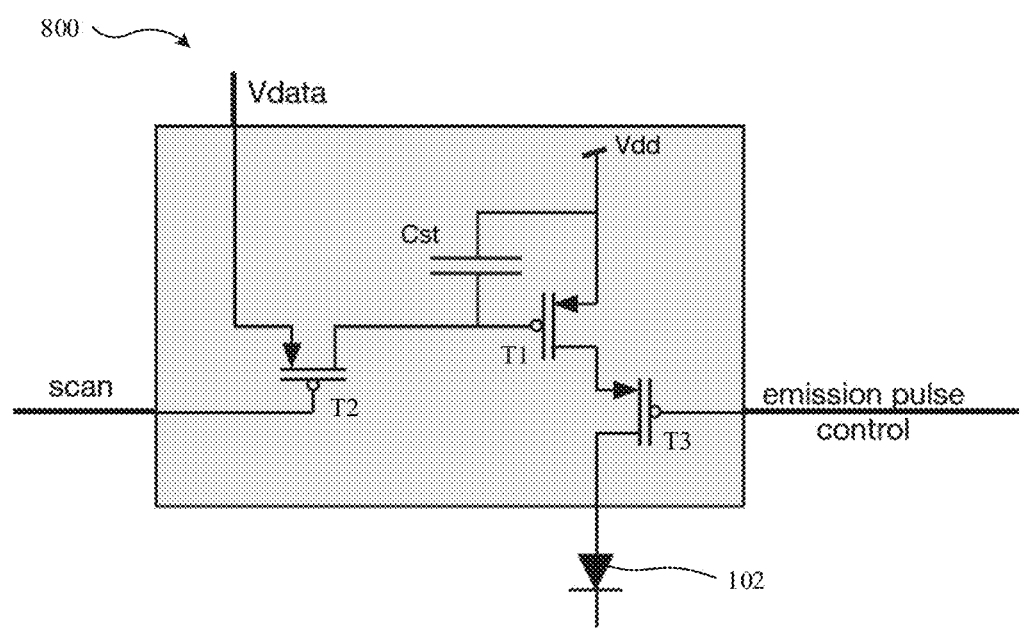
FIG. 8 is an illustration of an analog unit cell of a pixel driver chip in accordance with an embodiment.

FIG. 8 is an illustration of an analog unit cell 800 of a pixel driver chip 200 in accordance with an embodiment. The analog unit cell 800 is merely an example, and other pixel circuits may be utilized. As illustrated, analog unit cell 800 may include a storage capacitor (Cst) for holding the data voltage, a current driving transistor T1, a switching transistor T2 for sample and hold, and a switching transistor T3 for turning emission on and off. In an embodiment, Vdata (input) analog signals (e.g., from a column driver chip 320) is sampled by the switching transistor T2 and sets the gate voltage of the current driving transistor T1. In an embodiment, scan signals to the switching transistor T2 and emission pulse control signals to switching transistor T3 may be generated from one or more row driver chips 310.

Figure 9:
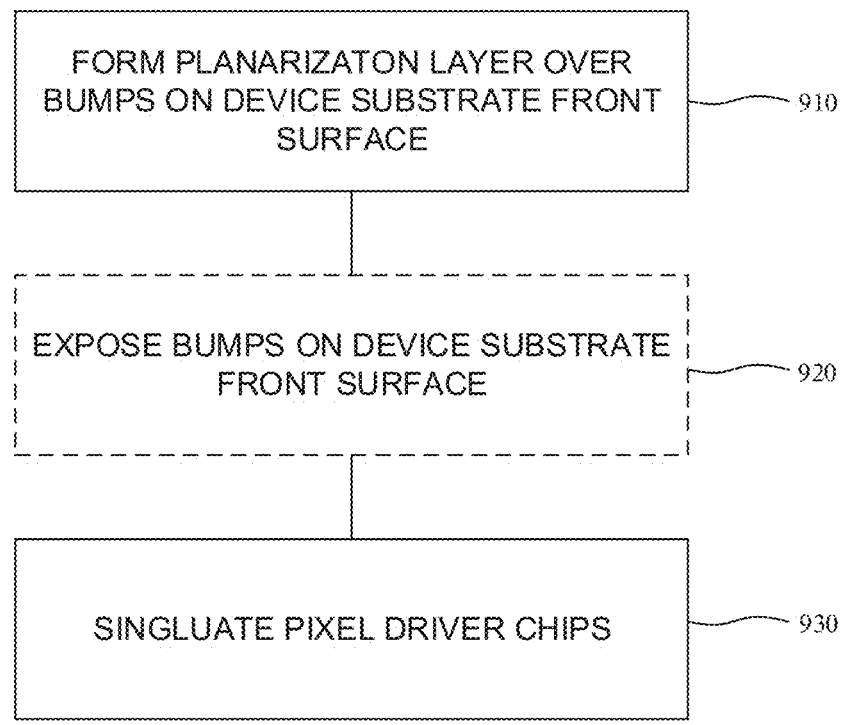
FIG. 9 is an illustration of a method of forming pixel driver chips in accordance with an embodiment.

FIG. 9 is an illustration of a method of forming pixel driver chips in accordance with an embodiment. In interest of clarity, the following description of FIG. 9 is made with regard to the schematic cross-sectional side view illustrations of FIGS. 10-12. As a starting point, a device substrate 210 may include active device regions 220 in a device layer. In an embodiment, device substrate 210 is a single crystalline silicon wafer, though other types of wafers may be used, such as silicon on insulator, or wafers formed from MN semiconductor materials. In accordance with embodiments, the active device regions 220 contain the device components to be included in the pixel driver chips 200. It is to be appreciated, that while the following processes and processing sequences are described with regard to the manufacture of pixel driver chips 200, that the processes and processing sequences are equally applicable to the fabrication of other device chips such as row driver chips 310 and column driver chips 320. In an embodiment, pixel driver chips 200, row driver chips 310, and column driver chips 320 can all be fabricated from the same device substrate 210.

Referring to FIG. 10, a starting device substrate 210 may be a standard silicon wafer with an exemplary thickness between 200-1,000 μm, though other thicknesses may be used, particularly depending upon wafer size (e.g., diameter). Metal pads 230 may be formed on the device substrate 210. A passivation layer 240 may cover the device substrate 210 and include openings exposing the metal pads 230. In accordance with an embodiment, conductive bumps 250 (e.g., copper) are formed on the exposed metal pads 230. Conductive bumps 250 may include a single, or multiple layers.

As shown in FIG. 11, at operation 910 a planarization layer 260 is formed over the conductive bumps 250 on the front surface of the device substrate 210. Planarization layer 260 may be formed of an electrically insulating material. In an embodiment, planarization layer 260 is formed of a polymer fill material such as, but not limited to, polybenzoxazole (PBO). Planarization layer 260 may be formed using a suitable deposition technique such as slot coating or spin coating. In an embodiment, a front surface 261 of planarization layer 260 is planarized. For example, planarization may be achieved using chemical mechanical polishing (CMP) after depositing the planarization layer 260.

At operation 920, the conductive bumps 250 on the device substrate 210 front surface are optionally exposed. However, it is not necessary to expose the conductive bumps 250 at this processing stage for all embodiments. In the particular embodiment illustrated in FIG. 10, the top side 261 of the planarization layer 260 is over the top side 251 of the conductive bumps 250. At operation 930 the pixel driver chips 200 are singulated from the device substrate 210. As illustrated in FIG. 12, singulation may include first attaching the device substrate 210 to an adhesive (e.g., tape) layer 510 on a carrier substrate 500, followed by cutting to form individual pixel driver chips 200.

Figure 13:
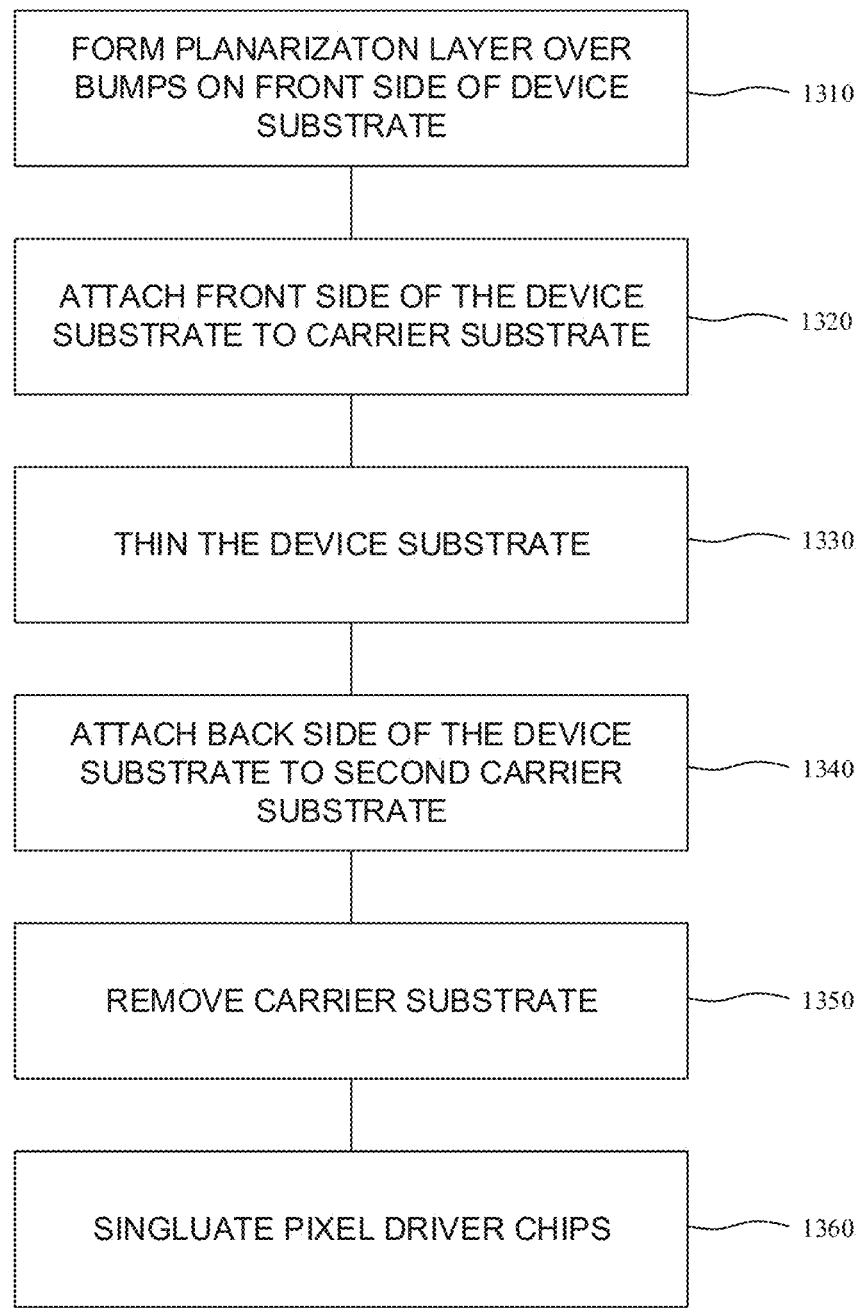
FIG. 13 is an illustration of a method of forming pixel driver chips in accordance with an embodiment.
Figure 16:
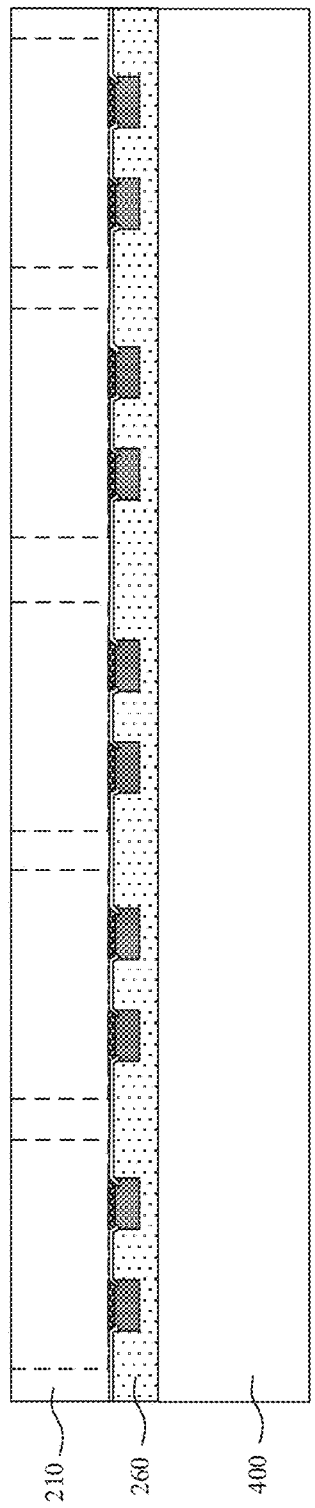
FIG. 16 is a schematic cross-sectional side view illustration of a thinned device substrate in accordance with an embodiment.

FIG. 13 is an illustration of a method of forming pixel driver chips in accordance with an embodiment. In interest of clarity, the following description of FIG. 13 is made with regard to the schematic cross-sectional side view illustrations of FIGS. 14-19. In interests of conciseness, description of features with substantial similarities to those previously described with regard to FIGS. 9-12 may not be repeated. Referring to FIG. 14, similar to operation 910, at operation 1310 a planarization layer 260 is formed over the conductive bumps 250 on the front surface of the device substrate 210. As shown in FIG. 15, at operation 1320 the front side of the device substrate 210 is attached to a carrier substrate 400. Referring now to FIG. 16, at operation 1330 the device substrate 210 is thinned, for example using a grinding technique (e.g., CMP), or a combination of etching and grinding. The resultant thickness of the thinned device substrate 210 may depend upon the resultant flexibility required of the display panel to be formed and depth of the active device regions 220. In an embodiment, the device substrate 210 is thinned to approximately 100 μm, though the thinned device substrate 210 may be thinner than 100 μm (e.g., 5 μm, 20 μm, etc.) or thicker than 100 μm.

Figure 17:
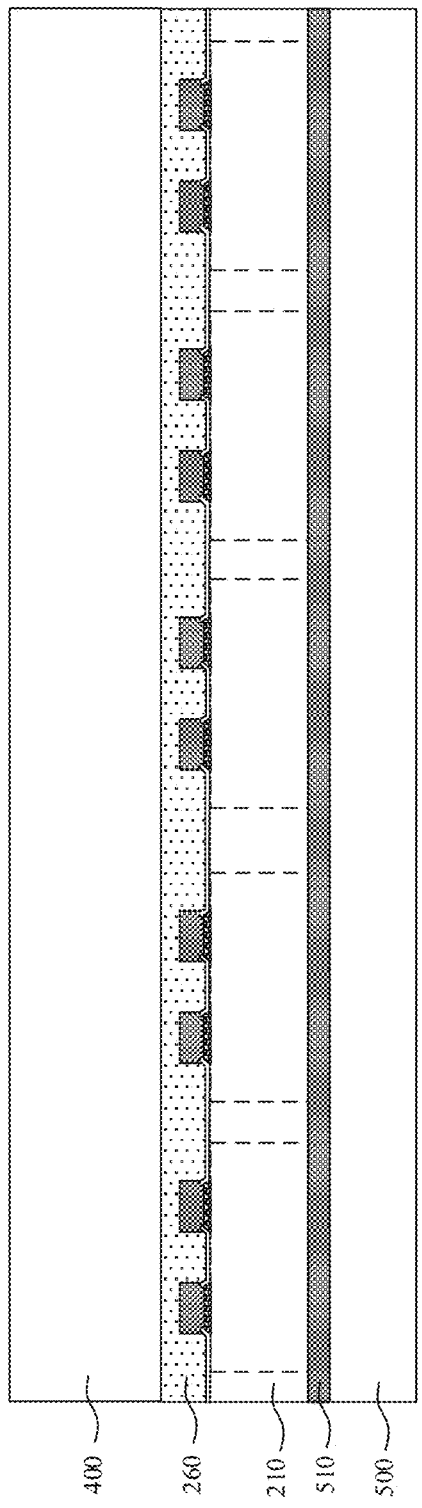
FIG. 17 is a schematic cross-sectional side view illustration of a thinned device substrate attached to a second carrier substrate in accordance with an embodiment.
Figure 18:
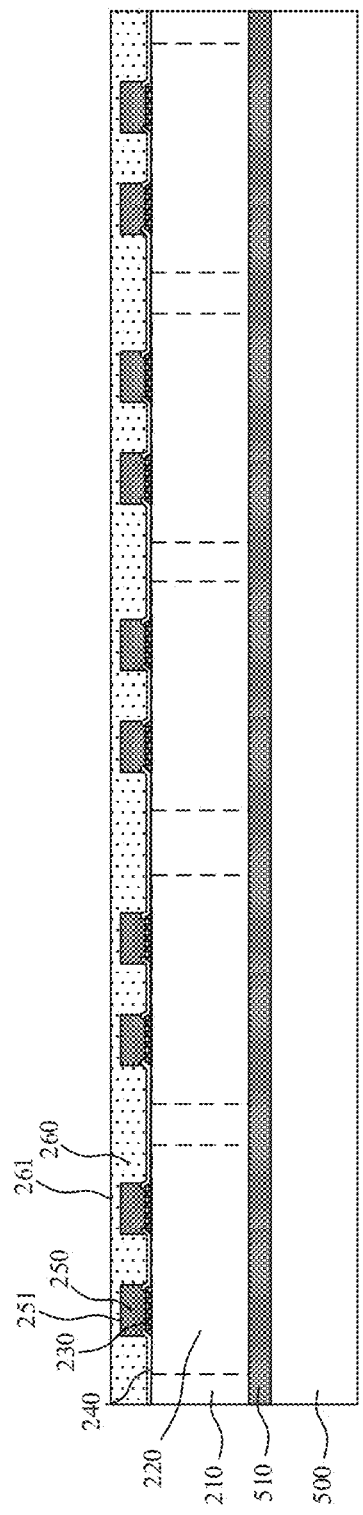
FIG. 18 is a schematic cross-sectional side view of a planarized planarization layer in accordance with an embodiment.
Figure 19:
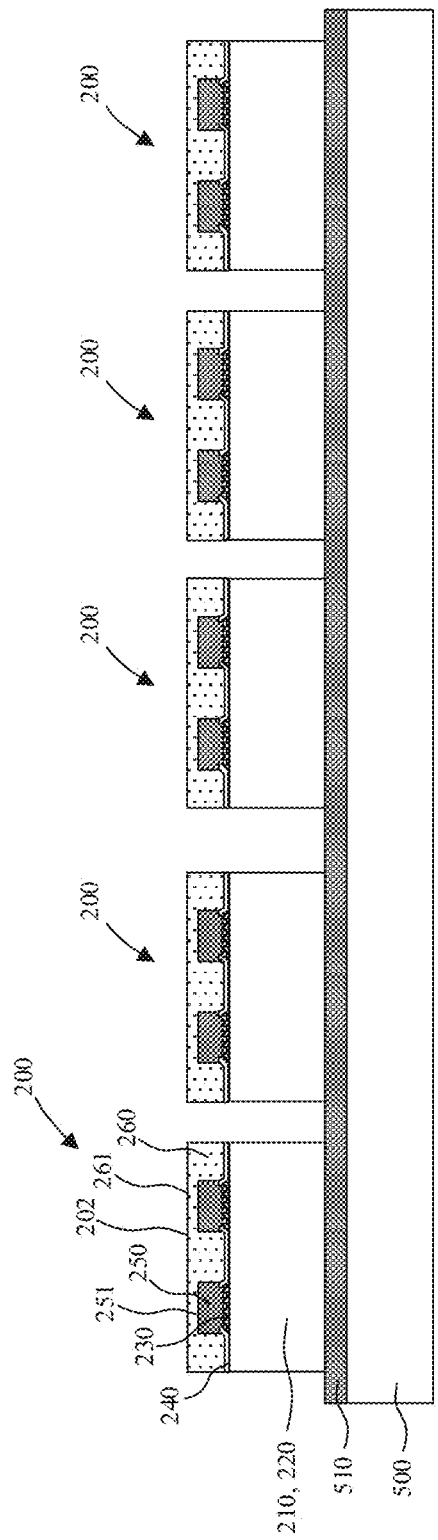
FIG. 19 is a schematic cross-sectional side view illustration of singulated pixel driver chips in accordance with an embodiment.

Referring now to FIG. 17, at operation 1340 the back side of the thinned device substrate 210 is attached to a second carrier substrate 500, for example, with an adhesive (e.g., tape) layer 510. The carrier substrate 400 is then removed at operation 1350, as illustrated in FIG. 18, and individual pixel driver chips 200 are singulated from the device substrate 210 at operation 1360, as illustrated in FIG. 19.

Figure 20:
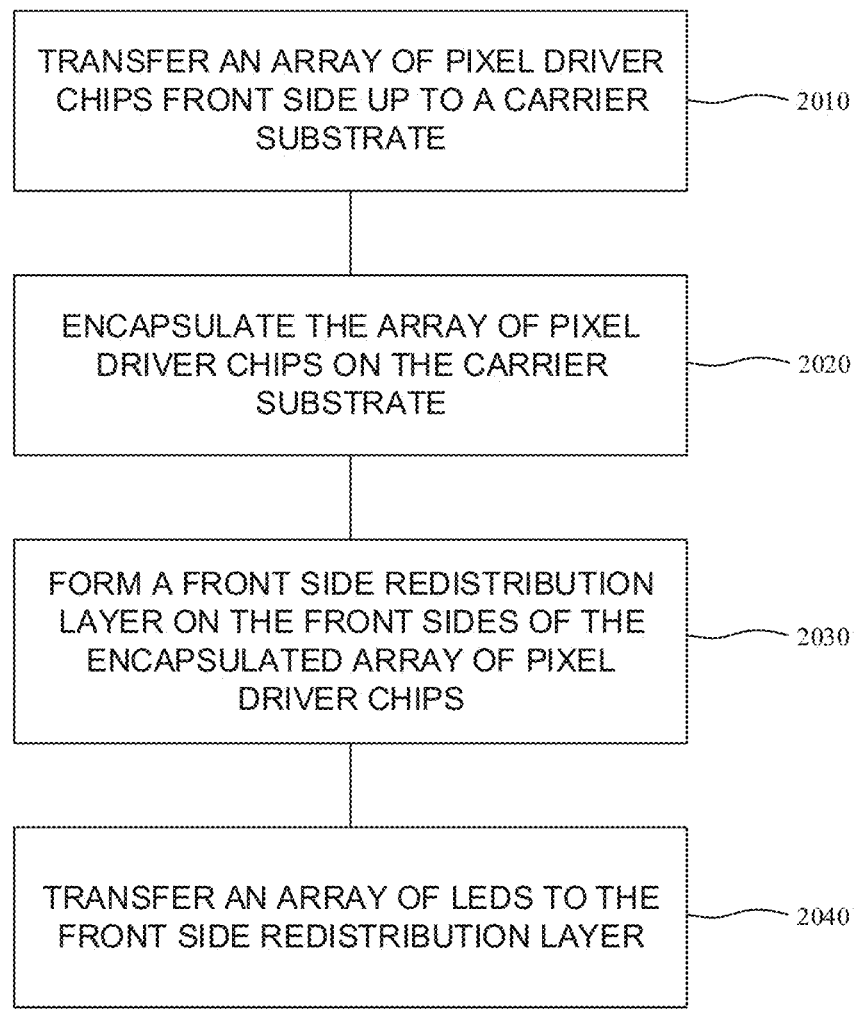
FIG. 20 is an illustration of a method of forming a display panel in accordance with an embodiment.
Figure 21:
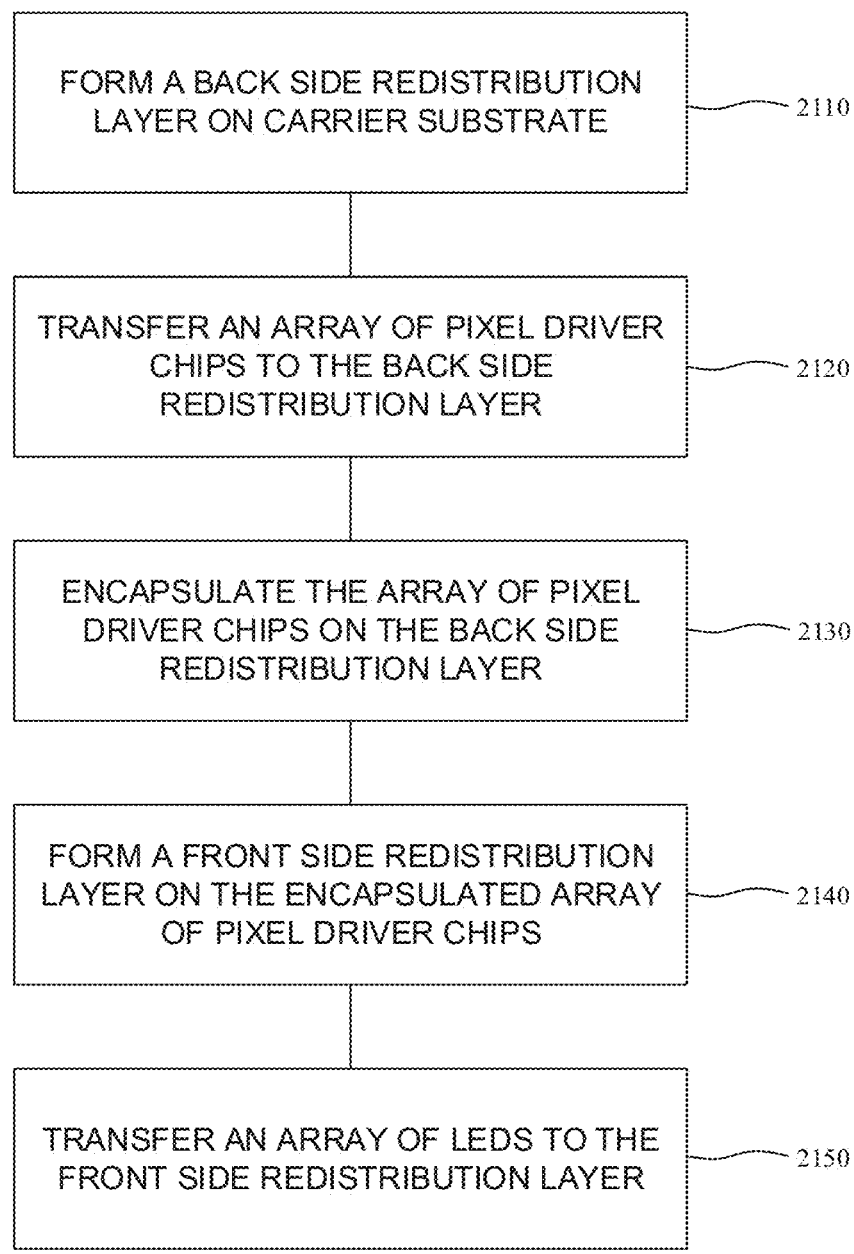
FIG. 21 is an illustration of a method of forming a display panel in accordance with an embodiment.

FIGS. 20-21 are illustrations of methods of forming display panels 100 in accordance with embodiments. In interest of clarity, the following description of FIGS. 20-21 is made with regard to reference features found in the schematic cross-sectional side view illustrations of FIGS. 22-27. Referring to FIG. 20, at operation 2010 an array of pixel driver chips 200 is transferred front side 202 up to a carrier substrate 600. At operation 2020 the array of pixel driver chips 200 is encapsulated on the carrier substrate 600. At operation 2030 a front side RDL 110 is formed on the front sides 202 of the encapsulated array of pixel driver chips 200. At operation 2040 an array of LEDs 102 is transferred to the front side RDL 110.

Referring to FIG. 21, at operation 2110 a back side RDL 120 is formed on a carrier substrate 600. At operation 2120 an array of pixel driver chips 200 is transferred to the back side RDL 120. At operation 2130 the array of pixel driver chips 200 is encapsulated on the back side RDL 120. At operation 2140 a front side RDL 110 is formed on the encapsulated array of pixel driver chips 200. At operation 2150 an array of LEDs 102 is transferred to the front side RDL 110.

Figure 22:
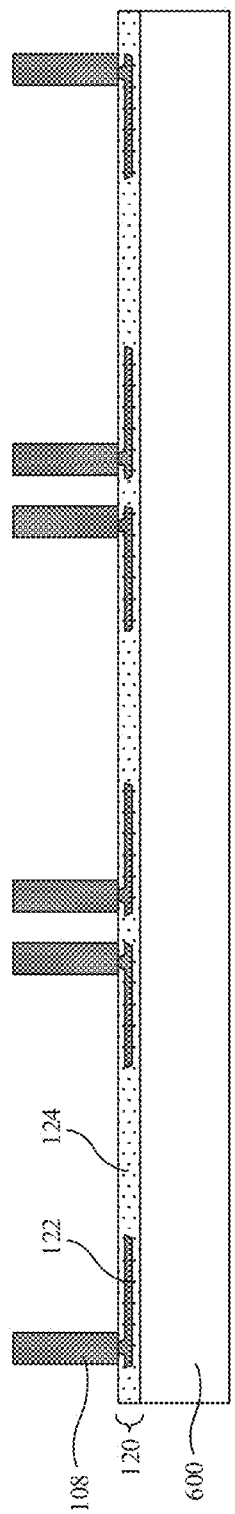
FIG. 22 is a schematic cross-sectional side view illustration of a plurality of conductive pillars formed on a back side RDL in accordance with an embodiment.

Referring now to FIG. 22, a back side RDL 120 is optionally formed on a carrier substrate 600, such as described with regard to operation 2110. Additionally, a plurality of conductive pillars 108 are optionally formed on the back side RDL 120. As described above, the formation of back side RDL 120 and conductive pillars 108 may allow for electrical connection to components on the back side of the display panel 100. However, back side connection is not necessarily required and is optional in accordance with embodiments. Accordingly, while the back side RDL 120 and conductive pillars 108 are illustrated and described, these features are not required.

Back side RDL 120 may have one or more redistribution lines 122 (e.g., copper) and dielectric layers 124. The back side RDL 120 may be formed by a layer-by-layer process, and may be formed using thin film technology. In an embodiment, the back side RDL 120 has a thickness of 5-50 μm. In an embodiment, the conductive pillars 108 are formed by a plating technique, such as electroplating using a patterned photoresist to define the conductive pillar 108 dimensions, followed by removal of the patterned photoresist layer. The material of conductive pillars 108 can include, but is not limited to, a metallic material such as copper, titanium, nickel, gold, and combinations or alloys thereof. In an embodiment, conductive pillars 108 are copper. In an embodiment, the conductive pillars 108 have a height (e.g., 100 μm) that is approximately the same as the thickness of the pixel driver chips 200.

Figure 23:
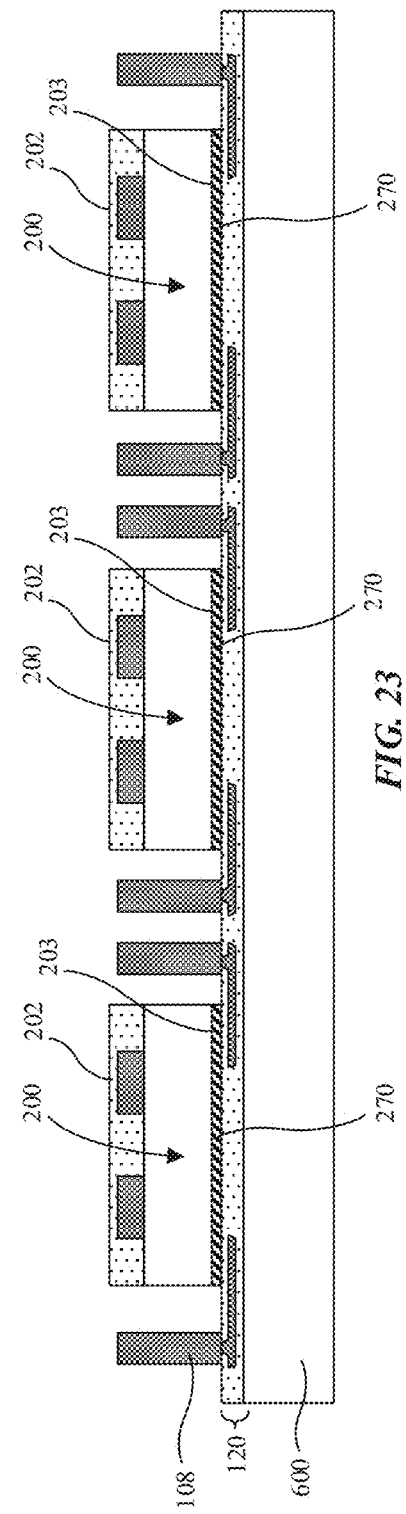
FIG. 23 is a schematic cross-sectional side view illustration of an array of pixel driver chips transferred face up to a carrier substrate in accordance with an embodiment.
Figure 24:
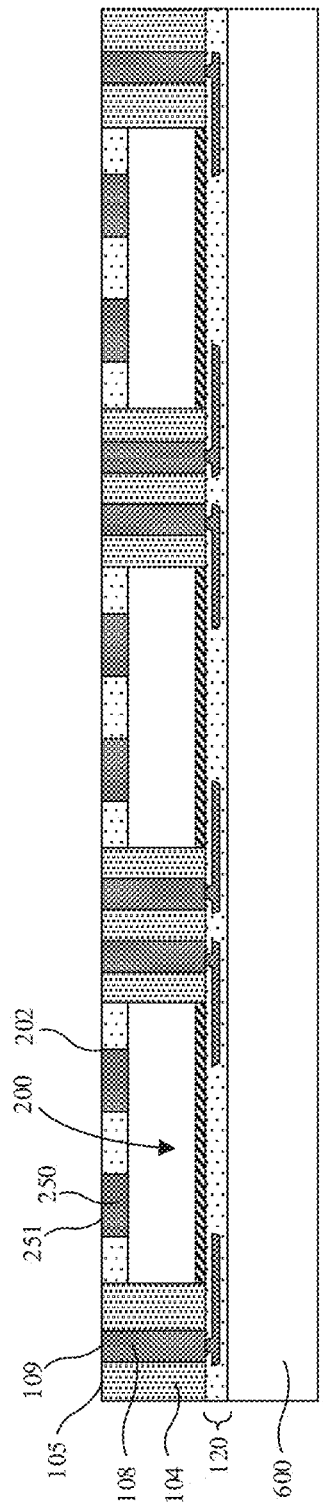
FIG. 24 is a schematic cross-sectional side view illustration of an array of pixel driver chips encapsulated on a carrier substrate in accordance with an embodiment.

Referring now to FIG. 23 an array of pixel driver chips 200 is transferred to the carrier substrate 600. In the embodiment illustrated, the pixel driver chips 200 are transferred front side 202 up on the carrier substrate 600. In an embodiment, the back sides 203 pixel driver chips 200 are attached to the carrier substrate 600 using a die attach film 270. In accordance with embodiments including a back side RDL 120, the pixel driver chips 200 are transferred front side 202 up on the back side RDL 120, and may be attached using die attach film 270.

The array of pixel driver chips 200 and optionally conductive pillars 108 are then encapsulated in an insulator layer 104. While not illustrated separately, row driver chips 310 and column driver chips 320 may also be encapsulated within the insulator layer 104 in certain configurations.

The insulator layer 104 may include a molding compound such as a thermosetting cross-linked resin (e.g., epoxy), though other materials may be used as known in electronic packaging. Encapsulation may be accomplished using a suitable technique such as, but not limited to, transfer molding, compression molding, and lamination. The insulator layer 104 may cover the front sides 109 of the conductive pillars 108 and front sides 202 of the pixel driver chips 200 following encapsulation. Following encapsulation, the front side 105 of the insulator layer 104 may be processed to expose the front sides 109 of the conductive pillars and front sides 251 of the conductive bumps 250. In an embodiment, the insulator layer is polished using CMP to form a planar front surface including front sides 105, 109, 251.

Figure 25:
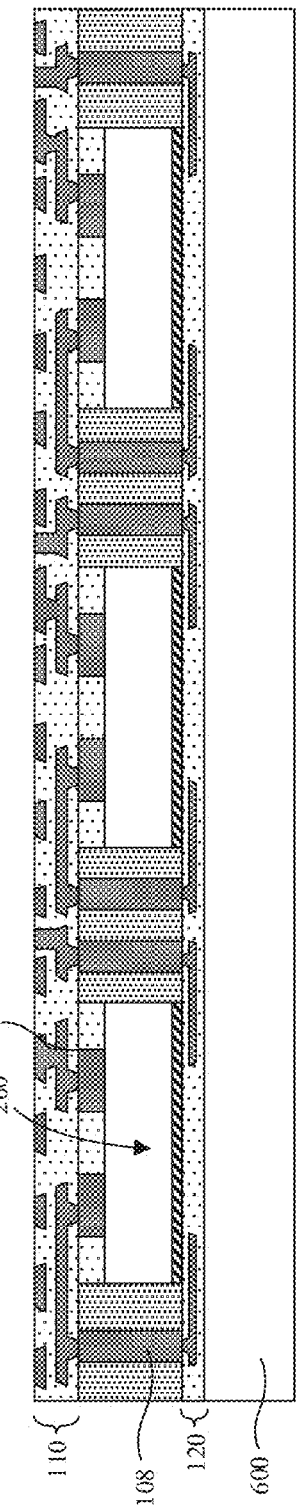
FIG. 25 is a schematic cross-sectional side view illustration of a front side RDL formed on an encapsulated array of pixel driver chips in accordance with an embodiment.

Referring now to FIG. 25, a front side RDL 110 is formed on the front sides 202 of the encapsulated array of pixel driver chips 200. When present, the front side RDL 110 may also be formed on the front sides of the encapsulated row driver chips 310 and column driver chips 320. Front side RDL 110 may have one or more redistribution lines 112 (e.g., copper) and dielectric layers 114. The front side RDL 110 may be formed by a layer-by-layer process, and may be formed using thin film technology. In an embodiment, the front side RDL 110 has a thickness of 5-50 μm. In an embodiment, the front side 111 of front side RDL 110 including contact pads 118 is planarized.

Figure 26:
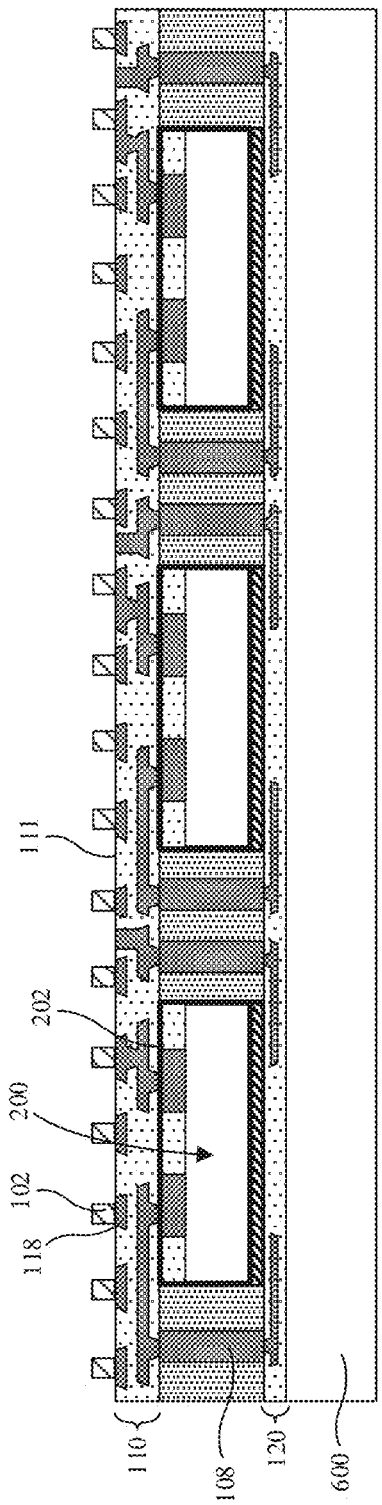
FIG. 26 is a schematic cross-sectional side view illustration of an array of LEDs transferred to a front side RDL in accordance with an embodiment.

LEDs 102 may be bonded to a respective contact pad 118 on a front side 111 of the front side RDL 110 as illustrated in FIG. 26. In an embodiment, prior to transferring the LEDs 102 solder posts (e.g., indium) may be formed on the contacts pads 118 to facilitate bonding the LEDs 102 to the contact pads 118.

Figure 27:
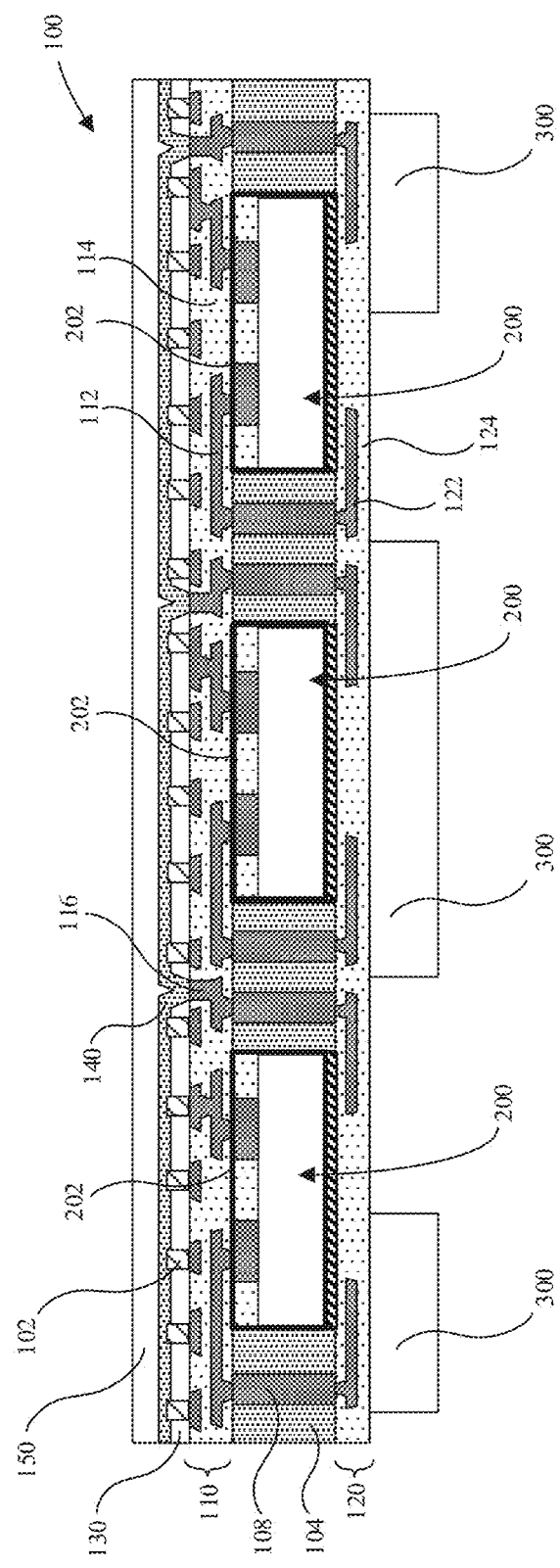
FIG. 27 is a schematic cross-sectional side view illustration of a display panel including embedded pixel driver chips in accordance with an embodiment.

Referring now to FIG. 27, a sidewall passivation layer 130 may then be formed laterally around the LEDs 102. Sidewall passivation layer 130 may be formed of an electrically insulating material such as, but not limited to, epoxy or acrylic, and may be transparent or opaque. One or more top conductive contact layers 140 may then be formed over one or more, or all of the LEDs 102. In an embodiment, top conductive contact layer 140 is transparent. For example, top conductive contact layer 140 may be formed of a transparent conductive oxide such as ITO, or a transparent conductive polymer such as PEDOT. In an embodiment, top conductive contact layer 140 is additionally formed on an in electrical contact with a $V_{SS}$ or ground line 116. A top encapsulation layer 150 may then be formed over the top conductive contact layer 140. Top encapsulation layer 150 may be formed of a transparent material. Carrier substrate 600 may be removed, and one or more device chips 300 may be attached to the back side of the display panel 100, for example, to the back side RDL 120.

Figure 28:
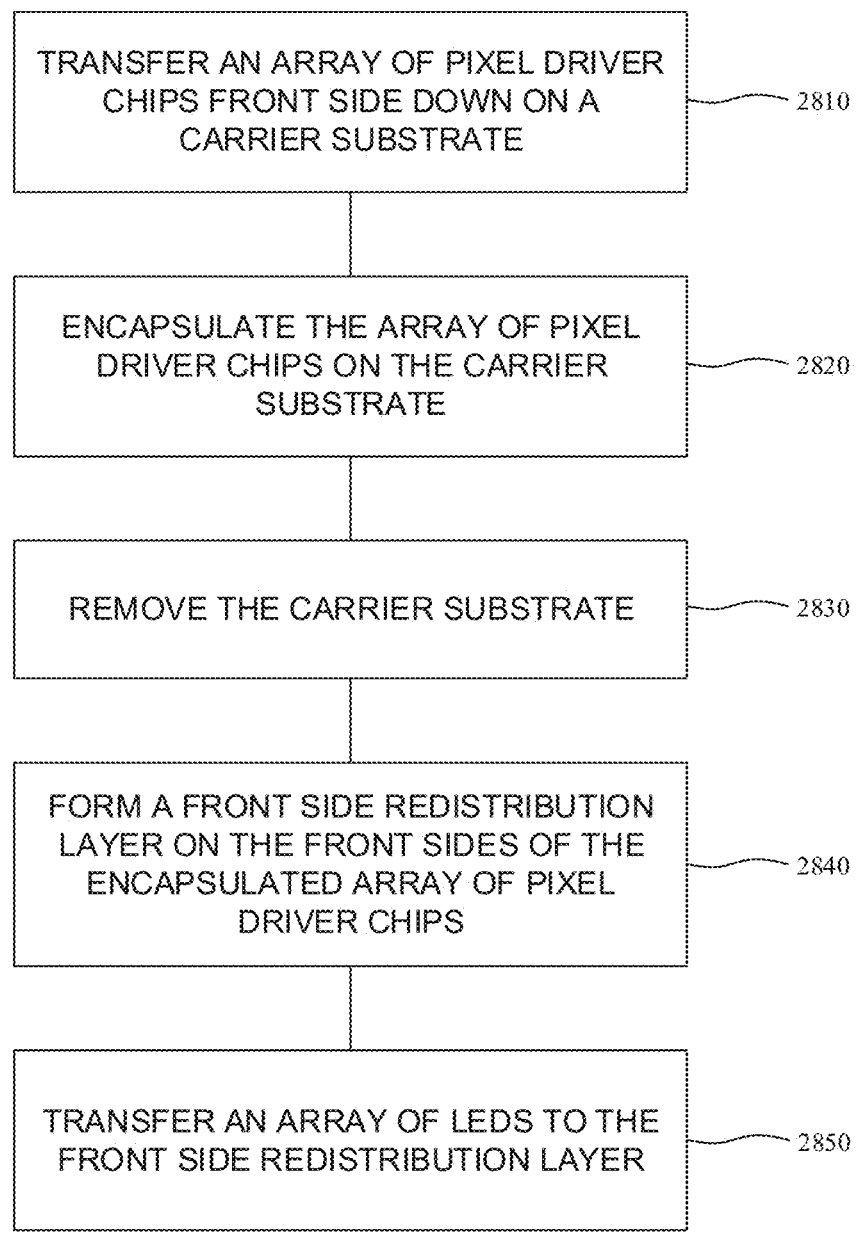
FIG. 28 is an illustration of a method of forming a display panel in accordance with an embodiment.
Figure 29:
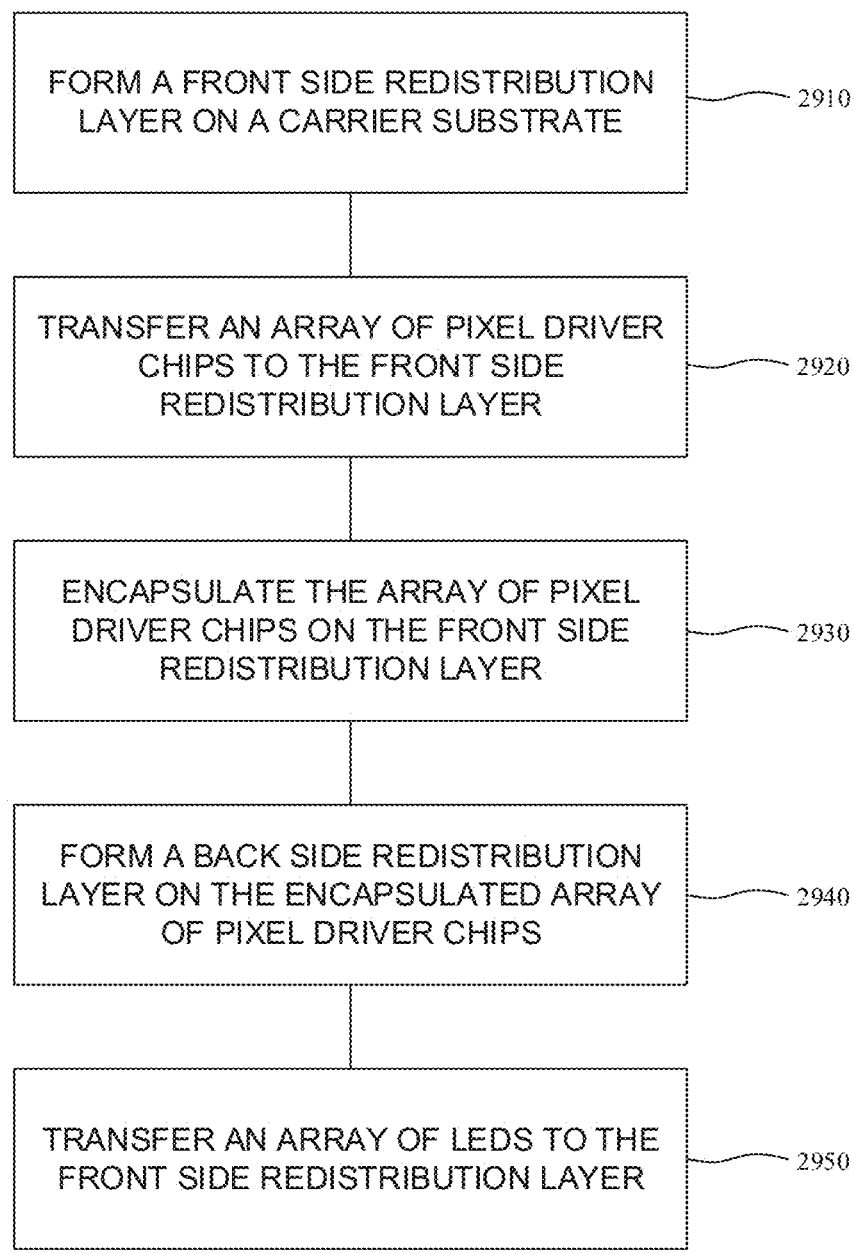
FIG. 29 is an illustration of a method of forming a display panel in accordance with an embodiment.

FIGS. 28-29 are illustrations of methods of forming display panels 100 in accordance with embodiments. In interest of clarity, the following description of FIGS. 28-29 is made with regard to reference features found in the schematic cross-sectional side view illustrations of FIGS. 30-34. Referring to FIG. 28, at operation 2810 an array of pixel driver chips 200 is transferred front side 202 down to a carrier substrate 610. At operation 2820 the array of pixel driver chips 200 is encapsulated on the carrier substrate 610. At operation 2830 the carrier substrate 610 is removed. At operation 2840 a front side RDL 110 is formed on the front sides 202 of the encapsulated array of pixel driver chips 200. At operation 2850 an array of LEDs 102 is transferred to the front side RDL 110.

Referring to FIG. 29, at operation 2910 a front side RDL 110 is formed on a carrier substrate 610. At operation 2920 an array of pixel driver chips 200 is transferred to the front side RDL 110. At operation 2930 the array of pixel driver chips 200 is encapsulated on the front side RDL 110. At operation 2940 a back side RDL 120 is formed on the encapsulated array of pixel driver chips 200. At operation 2950 an array of LEDs 102 is transferred to the front side RDL 110.

Figure 30:
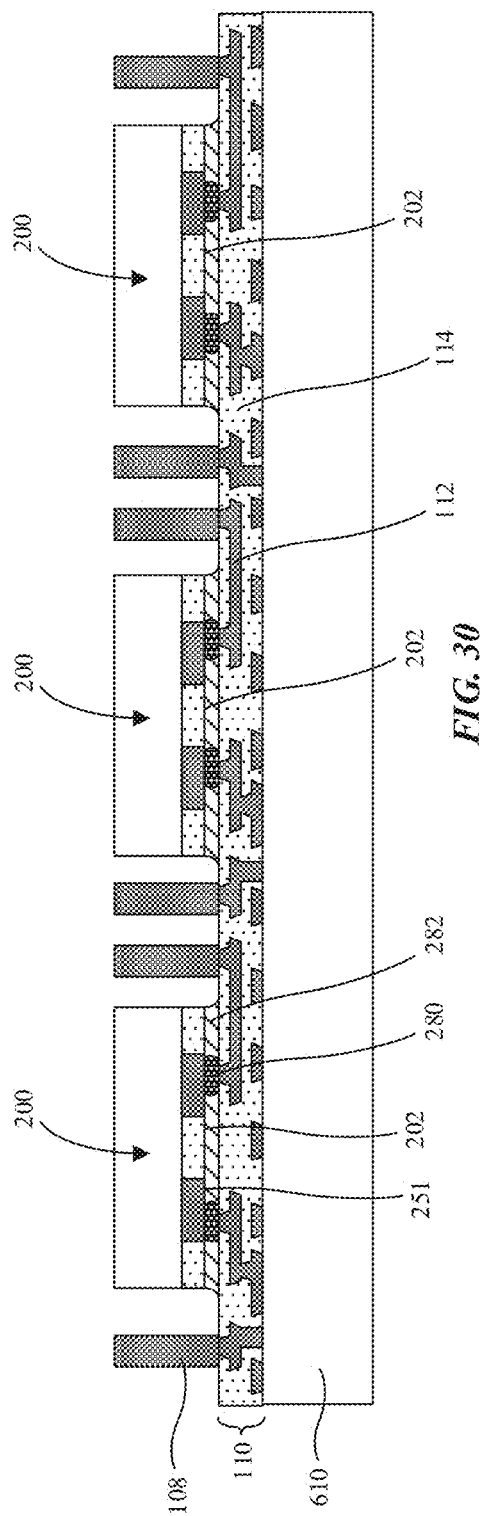
FIG. 30 is a schematic cross-sectional side view illustration of an array of pixel driver chips transferred face down to a carrier substrate in accordance with an embodiment.

Referring now to FIG. 30, a front side RDL 110 is formed on a carrier substrate 610, such as described with regard to operation 2910. Additionally, a plurality of conductive pillars 108 are optionally formed on the front side RDL 110. As described above, formation of the conductive pillars 108 may allow for electrical connection to components on the back side of the display panel 100. However, back side connection is not necessarily required and is optional in accordance with embodiments. Accordingly, while conductive pillars 108 are illustrated and described, these features are not required.

Front side RDL 110 may have one or more redistribution lines 112 (e.g., copper) and dielectric layers 114. The front side RDL 110 may be formed by a layer-by-layer process, and may be formed using thin film technology. In an embodiment, the front side RDL 110 has a thickness of 5-50 µm. In an embodiment, the conductive pillars 108 are formed by a plating technique, such as electroplating using a patterned photoresist to define the conductive pillar 108 dimensions, followed by removal of the patterned photoresist layer. The material of conductive pillars 108 can include, but is not limited to, a metallic material such as copper, titanium, nickel, gold, and combinations or alloys thereof. In an embodiment, conductive pillars 108 are copper. In an embodiment, the conductive pillars 108 have a height (e.g., 100 µm) that is approximately the same as the thickness of the pixel driver chips 200.

Still referring to FIG. 30 an array of pixel driver chips 200 is transferred to the carrier substrate 610. In the embodiment illustrated, the pixel driver chips 200 are transferred front side 202 down on the carrier substrate 610. In accordance with embodiments including a front side RDL 110, the pixel driver chips 200 are transferred front side 202 down on the front side RDL 110. In an embodiment, the pixel driver chips 200 may be bonded to the front side RDL 110 with conductive bumps, such as solder bumps 280. An underfill material 282 may optionally be applied around/under the pixel driver chips 200 to preserve the integrity of the electrical connections.

Figure 31:
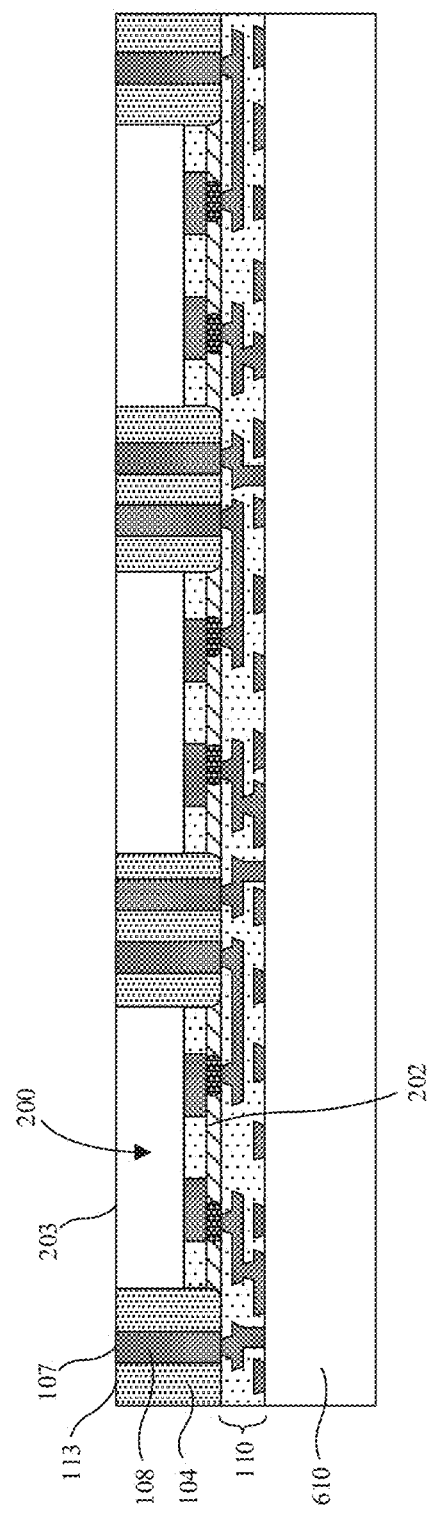
FIG. 31 is a schematic cross-sectional side view illustration of an array of pixel driver chips encapsulated on a carrier substrate in accordance with an embodiment.

As illustration in FIG. 31, the array of pixel driver chips 200 and optionally conductive pillars 108 are then encapsulated in an insulator layer 104. While not illustrated separately, row driver chips 310 and column driver chips 320 may also be encapsulated within the insulator layer 104 in certain configurations.

The insulator layer 104 may include a molding compound such as a thermosetting cross-linked resin (e.g., epoxy), though other materials may be used as known in electronic packaging. Encapsulation may be accomplished using a suitable technique such as, but not limited to, transfer molding, compression molding, and lamination. The insulator layer 104 may cover the back sides 107 of the conductive pillars 108 and back sides 203 of the pixel driver chips 200 following encapsulation. Following encapsulation, the back side 113 of the insulator layer 104 may be processed to expose the back sides 107 of the conductive pillars 108 and, optionally the back sides 203 of the pixel driver chips 200. In an embodiment, the insulator layer is polished using CMP to form a planar back surface including back sides 107, 113, 203.

Figure 32:
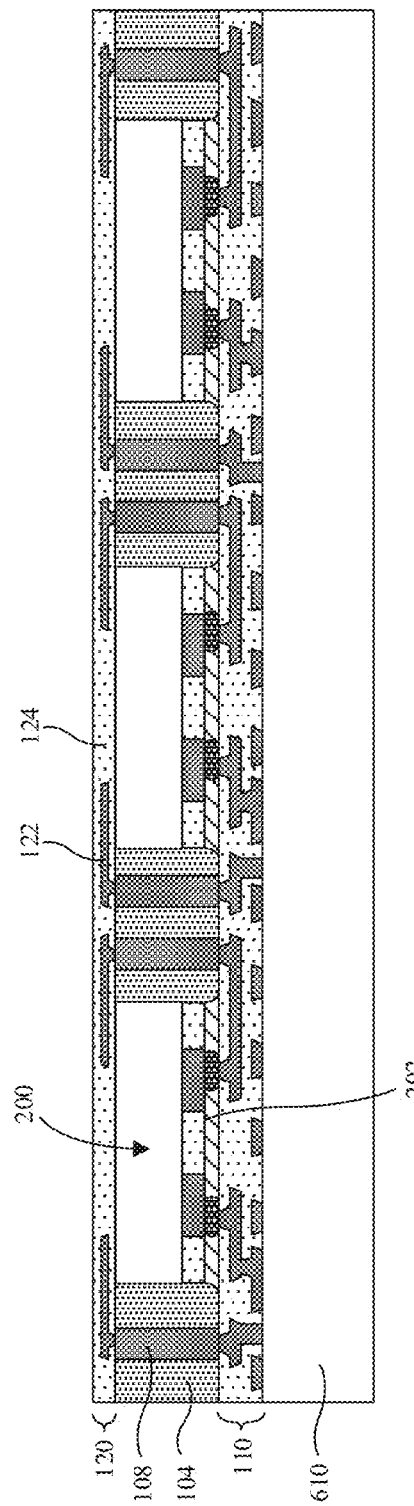
FIG. 32 is a schematic cross-sectional side view illustration of a back side RDL formed on an encapsulated array of pixel driver chips in accordance with an embodiment.

Referring now to FIG. 32, a back side RDL 120 is optionally formed on the back sides 203 of the encapsulated array of pixel driver chips 200. When present, the back side RDL 120 may also be formed on the back sides of the encapsulated row driver chips 310 and column driver chips 320. Back side RDL 120 may have one or more redistribution lines 122 (e.g., copper) and dielectric layers 124. The back side RDL 120 may be formed by a layer-by-layer process, and may be formed using thin film technology. In an embodiment, the back side RDL 120 has a thickness of 5-50 µm.

Figure 33:
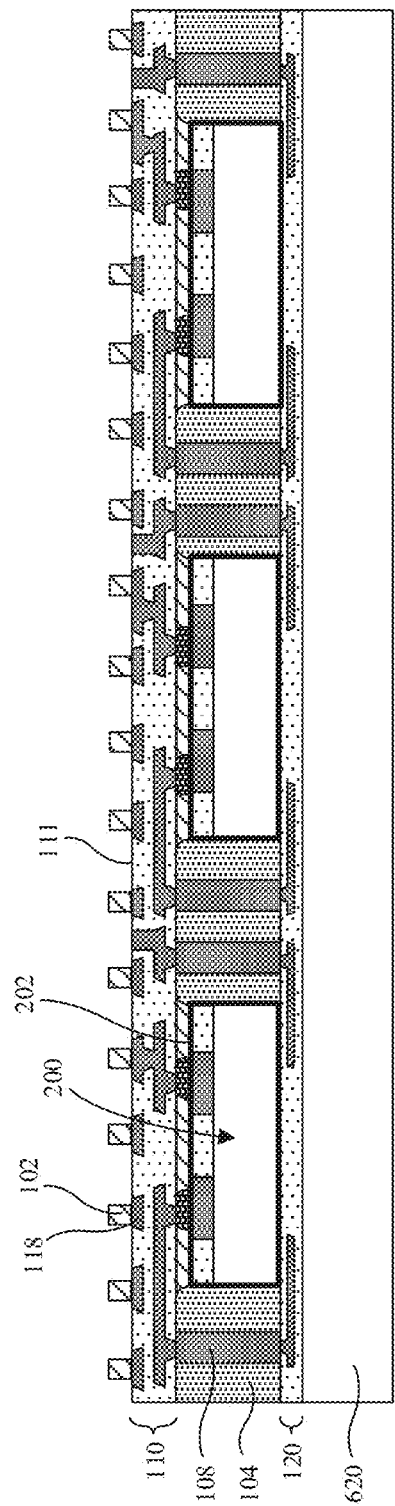
FIG. 33 is a schematic cross-sectional side view illustration of an array of LEDs transferred to a front side RDL in accordance with an embodiment.

Referring to FIG. 33, the carrier substrate 610 is removed from the front side RDL 110, and a second carrier substrate 620 may optionally be attached to the back side RDL 120, if present, to provide structural support. The front side RDL 110 may have a planar front side 111 after removal of the carrier substrate 610, though a planarization operation such as CMP may be performed to planarize the front side 111. LEDs 102 may be bonded to a respective contact pad 118 on a front side 111 of the front side RDL 110. In an embodiment, prior to transferring the LEDs 102 solder posts (e.g., indium) may be formed on the contacts pads 118 to facilitate bonding the LEDs 102 to the contact pads 118.

Figure 34:
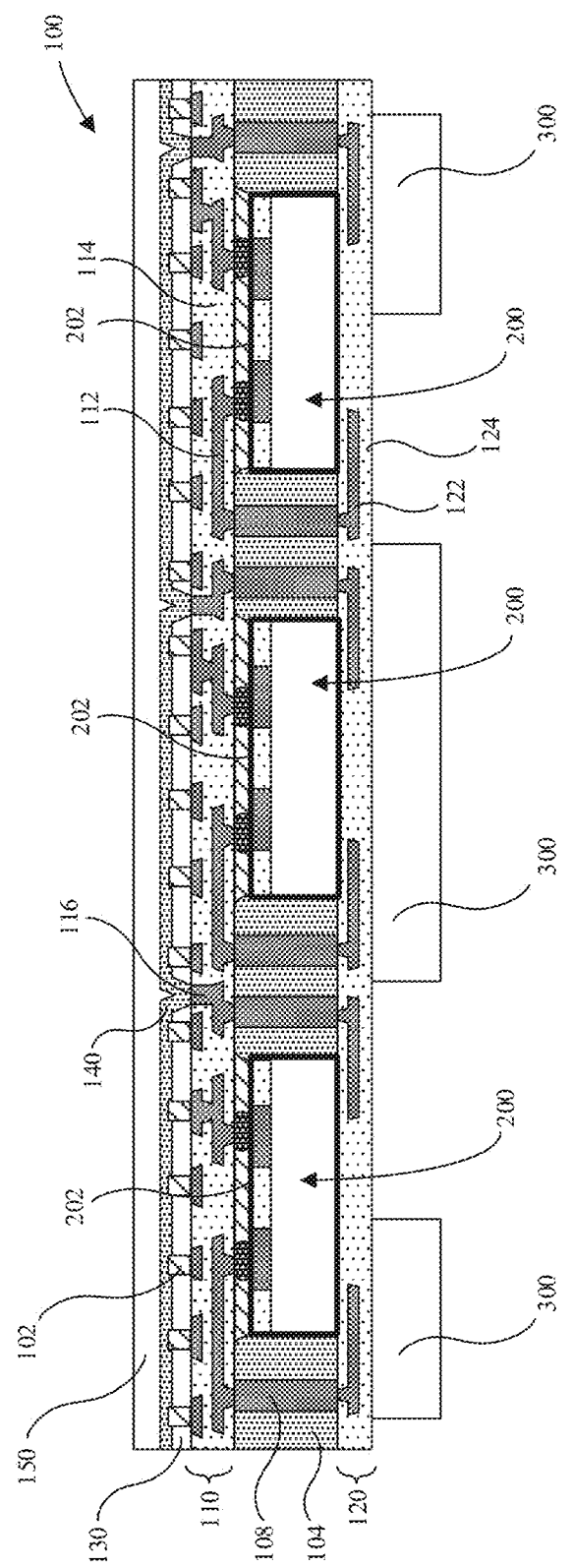
FIG. 34 is a schematic cross-sectional side view illustration of a display panel including embedded pixel driver chips in accordance with an embodiment.

Referring now to FIG. 34, a sidewall passivation layer 130 may then be formed laterally around the LEDs 102. Sidewall passivation layer 130 may be formed of an electrically insulating material such as, but not limited to, epoxy or acrylic, and may be transparent or opaque. One or more top conductive contact layers 140 may then be formed over one or more, or all of the LEDs 102. In an embodiment, top conductive contact layer 140 is transparent. For example, top conductive contact layer 140 may be formed of a transparent conductive oxide such as ITO, or a transparent conductive polymer such as PEDOT. In an embodiment, top conductive contact layer 140 is additionally formed on an in electrical contact with a $V_{SS}$ or ground line 116. A top encapsulation layer 150 may then be formed over the top conductive contact layer 140. Top encapsulation layer 150 may be formed of a transparent material. The second carrier substrate 620 may be removed, and one or more device chips 300 may be attached to the back side of the display panel 100, for example, to the back side RDL 120.

It is to be appreciated that the processing sequences described and illustrated in FIGS. 9-34 are exemplary, and embodiments are not necessarily so limited. For example, it is not required for the pixel driver chips 200 to be attached to an RDL with a die attach film or conductive bump. Processing sequence variations may be used to form a display panel in which the RDLs are formed directly on the front and back sides of the insulator layer or pixel driver chips 200. Accordingly, a number of variations are possible in accordance with embodiments.

In another aspect, embodiments may be implemented for the formation of scalable, large-area solution for high-resolution LED displays. Additionally, the disclosed embodiments may be general purposed backplanes used for all emissive and reflective electro-optical media, such as LED, OLED, quantum dot (QD), LCD or electronic ink (E Ink) as the backplane functionality may be vertically separated from the electro-optical layers, similar to conventional TFT backplane stack-ups. Although very large TFT backplanes can be manufactured, the TFTs are limited in the amount of current they can reliably supply to the LEDs and are therefore not an optimal choice. The use of pixel driver chips in accordance with embodiments instead of TFTs may provide a solution to this issue, and vertical separation of the pixel driver chips and LEDs lift restrictions on size and resolution of the displays that may otherwise exist with side-by-side integration of LED and pixel driver chips. Vertical integration may also improve IC performance, and provide additional space for the integration of pixel optics such as micro-lenses and in-pixel diffusers. In addition, embodiments may further reduce the display borders, while still giving room for further integration of functionality in the pixel driver chip layer. Application areas may include emissive and reflective displays, lighting, large area sensor arrays (e.g. x-ray) and even solar.

In one aspect, the pixel driver chips in accordance with embodiments are not competing for space in the same layer as the electro-optical layer (e.g. LEDS). As a result, the maximum resolution of the display can be increased (i.e. the minimum pixel size can be lower), while at the same time the pixel driver chips can have an optimal size and shape for a Si area-effective solution that is scalable to large display sizes (performance and cost benefit). In addition, the architectures in accordance with embodiments may decouple the light emitting devices from the silicon devices, resulting in more room for additional functionality, such as row drivers, column drivers, sensors or touch. Further, this opens the way to pixel driver chips with their contacts facing up instead of down. This solves a pixel driver chip contacting problem as it separates the pixel driver chip placement from making low-ohmic contacts between the layers containing the metal traces and the pixel driver chip contact pads (yield benefit).

In accordance with embodiments, rather than utilizing a micro-bonding technique to bond pixel drive chips to backplane traces, the backplane traces are instead formed on the contact pads (or conductive bumps as previously described) of the pixel driver chips. Thus high resolution and high temperature, and thus high-risk bonding steps, may be avoided and replaced using main-stream lithography methods for making the connections, which further facilitates scaling to larger pixel driver chips and more driver pads for cost-effective large-area displays.

In another aspect, embodiments may be used for the fabrication of displays with reduced border. TFT backplanes used in current main-stream display technologies can have narrow borders, but are not able to completely eliminate the borders, as the area under the pixels is completely filled with circuitry, requiring global trace routing to be done in the display borders. Pixel driver chip architectures in accordance with embodiments may reduce the border significantly by having a much smaller feature size (e.g. 40 nm versus 1 µm) and reduce the trace count needed per pixel in the display by using a high-speed data bus architecture. The proposed architectures can reduce this even further and enable more organic shaped backplanes. Thus, with the pixel driver chips in a separate layer, there is freedom to position all pixel driver chips within the active-pixel area of the display, even with organic (e.g. rounded) border shapes. This reduces the display border to a minimum (design space benefit).

Figure 35:
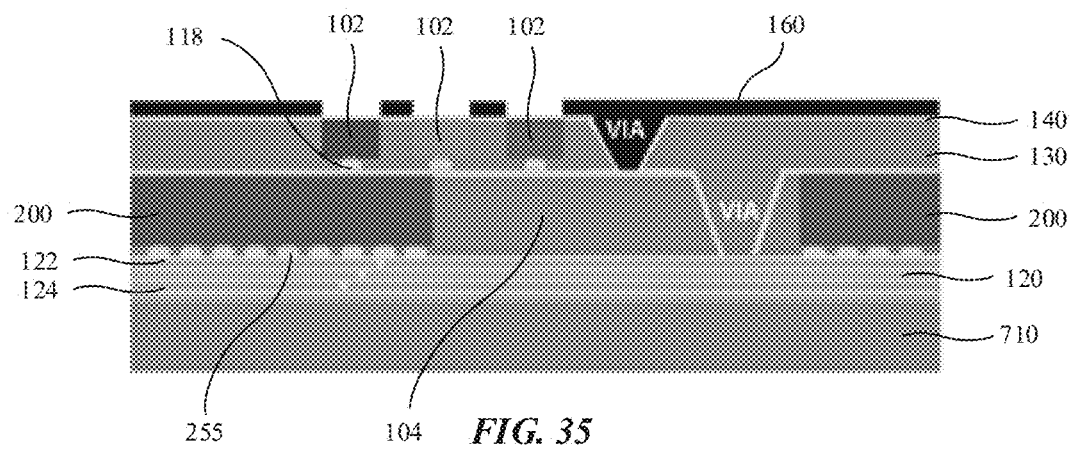
FIG. 35 is a schematic cross-sectional side view illustration of a display panel including embedded pixel driver chips with bottom contacts and a back side RDL in accordance with an embodiment.
Figure 36:
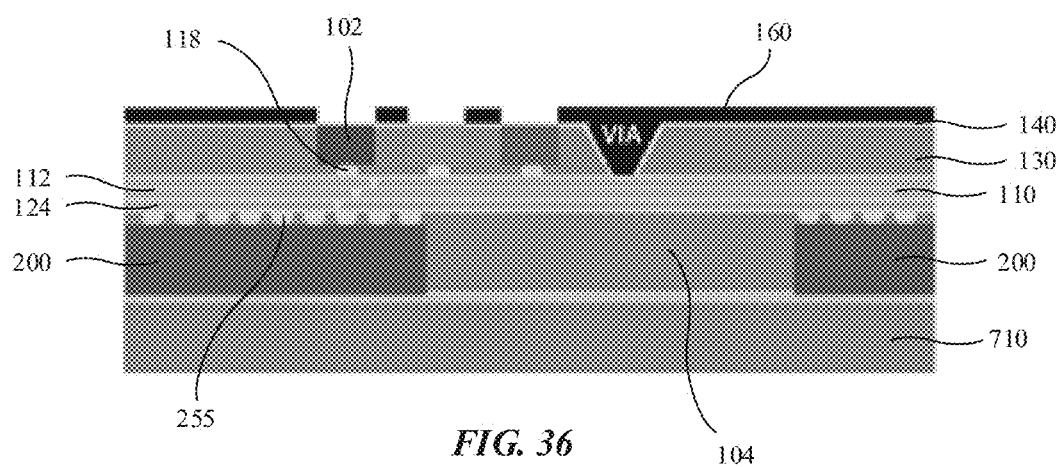
FIG. 36 is a schematic cross-sectional side view illustration of a display panel including embedded pixel driver chips with top contacts and a front side RDL in accordance with an embodiment.
Figure 37:
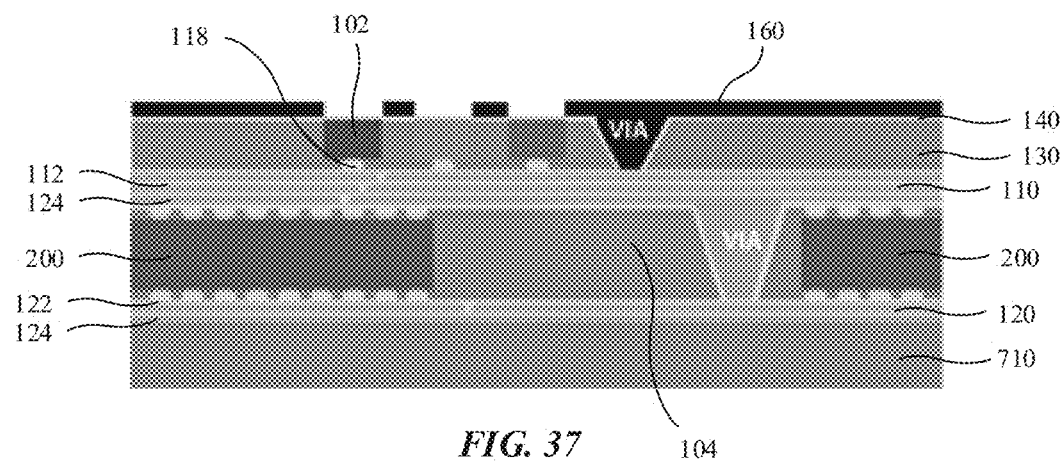
FIG. 37 is a schematic cross-sectional side view illustration of a display panel including embedded pixel driver chips with top and bottom contacts and front and back side RDLs in accordance with an embodiment.

Referring now to FIGS. 35-38, schematic cross-sections are shown where the pixel driver chips are positioned under the electro-optical layer. FIG. 35 is a schematic cross-sectional side view illustration of a display panel including embedded pixel driver chips 200 with bottom contact pads 255 and a back side RDL 120 in accordance with an embodiment. FIG. 36 is a schematic cross-sectional side view illustration of a display panel including embedded pixel driver chips 200 with top contact pads 255 and a front side RDL 110 in accordance with an embodiment. The placement of the pixel driver chips 200 in this embodiment only requires a surface with enough adhesion force to make the pixel driver chips "stick" when they are placed on the surface, e.g. using flip chip technique or other placement tool. FIG. 37 is a schematic cross-sectional side view illustration of a display panel including embedded pixel driver chips 200 with top and bottom contact pads 255 and front and back side RDLs 110, 120 in accordance with an embodiment. Such a pixel driver chip configuration can be used to increase the contact density of the pixel driver chips without increasing the pixel driver chip area. In a specific implementation, all power supply lines may run under the pixel driver chips 200 in back side RDL 120, while all traces to the LEDs 102 run on top of the pixel driver chips 200 in RDL 110. This would limit the amount of traces under the pixel driver chips 200 making it possible to have wide power supply lines and at the same time have efficient routing between the pixel driver chips 200 and the LEDs 102 (or other display effects). As shown, a black matrix layer 160 may optionally be formed over the stacked structure to affect light emission and reflection.

In addition to the embodiments illustrated in FIGS. 35-37, other embodiments having the pixel driver chips in a different plane than the electro-optical layer are possible, such as embodiments where the pixel driver chips are in the layer above the electro-optical layer stack (so-called top pixel driver chip embodiments). As the pixel driver chips are opaque, emission needs to take place away from the pixel driver chip layer towards the viewer. Therefore such embodiments may have bottom emission through an optically clear substrate.

In contrast to conventional LTPS, low temperature polycrystalline oxide (LTPO), oxide and a-Si TFT technologies that require processing temperatures higher than 300° C., the backplane processing using pixel driver chips in accordance with some embodiments can be carried out with a temperature budget below 200° C. This opens up the use of a wider range of plastic substrates compared to the conventional TFT processes that currently all use yellow polyimide (PI) substrates, including low-cost optically clear substrates, such as polyethylene naphthalate (PEN) or even polyethylene terephthalate (PET) with maximum processing temperatures of approximately 200° C. and approximately 120° C., respectively.

Figure 38:
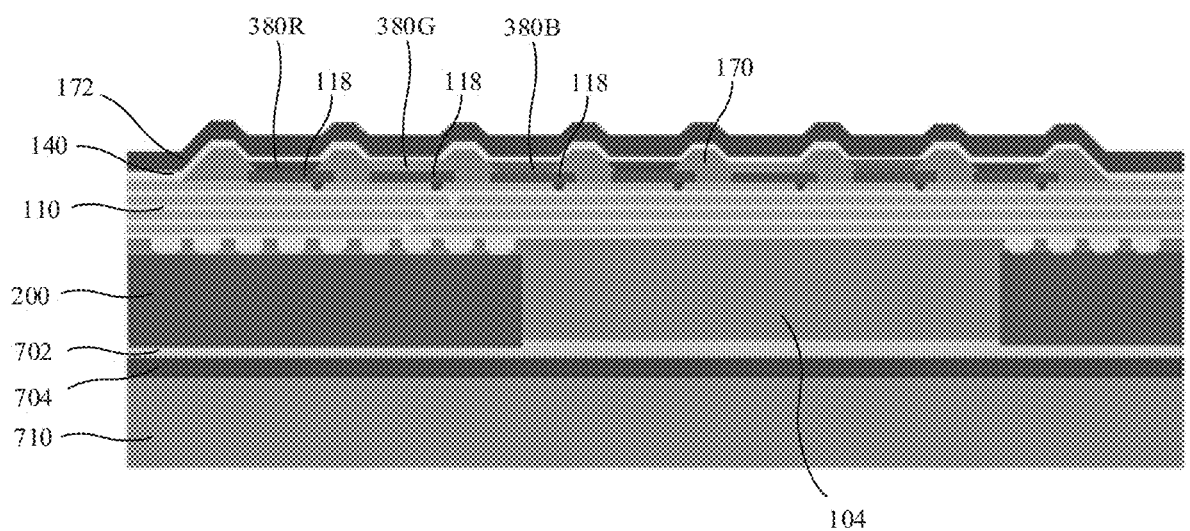
FIG. 38 is a schematic cross-sectional side view illustration of an OLED or QD display panel including embedded pixel driver chips in accordance with an embodiment.

The pixel driver chip architectures in accordance with embodiments may be combined with other electro-optical media, such as OLED, quantum dot (QD), LCD, electronic ink (E Ink). For example, embodiments may be compatible with an LCD in which the LCD is used in reflective mode, as otherwise the pixel driver chips locally block the light coming from the backlight unit. FIG. 38 is a schematic cross-sectional side view illustration of an OLED or QD display panel including embedded pixel driver chips in accordance with an embodiment including organic or emissive QD layers 380R, 380G, 380B in an exemplary RGB configuration. As OLED is sensitive to oxygen and water, encapsulation layers 172, 704 on the top and bottom of the stack may be included for sufficient lifetime. Additional layers such as a pixel defining layer 170 may also be present consistent with OLED and/or QD fabrication requirements or techniques. It is to be appreciated that while all three bottom pixel driver chip configurations shown in FIGS. 35-37 are possible here as well, only the top-contact pixel driver chip configuration consistent with FIG. 36 is shown in FIG. 38.

In accordance with embodiments, using pixel driver chips instead of TFTs for OLED may have significant implications on power consumption, borders, and functionality. For example, integration of pixel driver chips in OLED may lead to lower power consumption. In an exemplary comparison model, the pixel driver chips may only require 1.1V supply and add only around 1V of overhead in the emission path, while conventional TFT backplanes have a supply voltage of 10-18V and an overhead in the emission path of ~3-5V depending on the type of TFT technology used. With a voltage over the OLED stack of 5-6V this results in a reduction in power of 20%-40% for the emission part and at low emission power this can even be more than a factor of 2 as the addressing power consumption, determined by the supply voltage, becomes dominant.

With regard to narrowing borders, pixel driver chips can use high speed digital data-buses and buffers instead of direct source and gate connections in the case of conventional TFT backplanes, and the number of traces needed in the backplane may be much lower. Further, the pixel driver chips can be placed well within the display active-area border, even when organic shapes (e.g. rounded corners) are needed. This results in the capability of zero border displays, where only the environmental barriers have to extend into the border area.

With regard to integration and functionality, since the pixel driver chips can be produced with a much higher transistor density (e.g. 22 nm feature size at current node) compared to conventional TFT backplanes e.g. (1-2 µm feature size) the pixel driver chip embodiments leave a lot of space for further integration of functionality in the same plane, such as sensors or touch.

Figure 39:
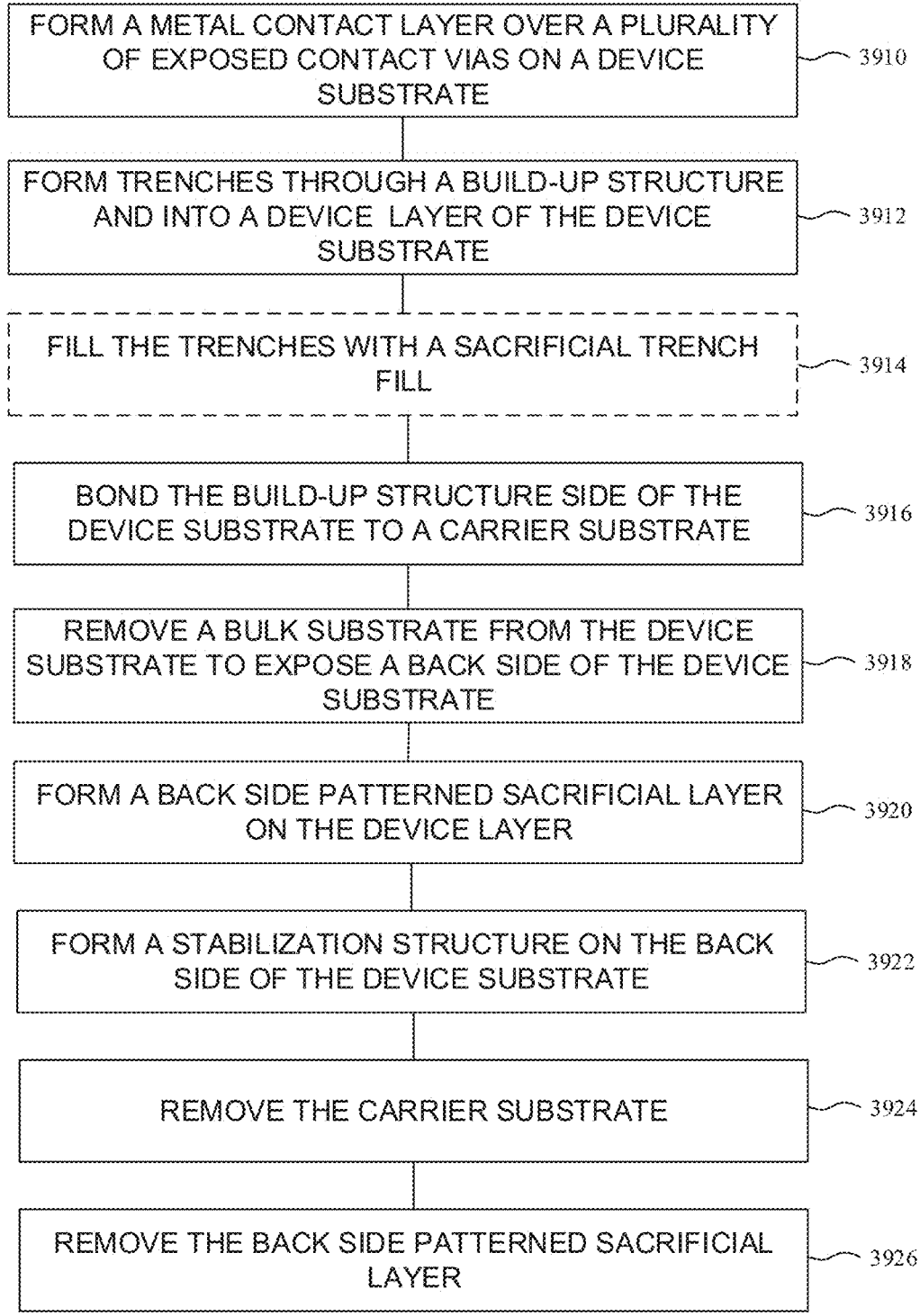
FIG. 39 is an illustration of a method of forming pixel driver chips in accordance with an embodiment.
Figure 44:
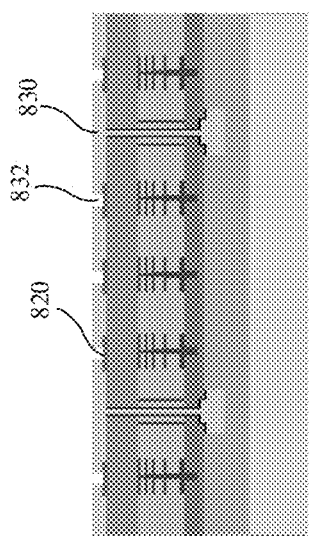
FIG. 44 is a schematic cross-sectional side view illustration of the formation of backside bond pads and post contact openings in accordance with an embodiment.

Referring now to FIG. 39 a method of forming pixel driver chips is provided in accordance with an embodiment. In particular, the method is related to the formation of top-contact pixel driver chips, though other processing sequences may be supplied for the formation of bottom-contacts, or both. The processing sequence illustrated in FIG. 39 may be an additive process using a combination of standard photolithographic processes and placement of pixel driver chips and LEDs using suitable transfer techniques such as flip chip or transfer with a micro device electrostatic transfer head assembly. In interest of conciseness and clarity, the following description of FIG. 39 is jointly made with regard to the schematic cross-sectional side view illustrations of FIGS. 40-47.

As shown in FIG. 40, the processing sequence may begin during the formation of a build-up structure 290 on a device substrate 210. For example, the device substrate 210 may include a device layer 220 including active regions formed over a bulk substrate 201 (e.g. silicon substrate). Build-up structure 290 may include a plurality of dielectric layers 292 and metal layers 291 and passivation layer 293. In the particular embodiment illustrated, a plurality of contact vias 295 are exposed. At operation 3910, a metal contact layer 802 is formed over a plurality of exposed contact vias 295 on the device substrate 210. The top metal contact layer 802 may be un-patterned at this stage. The top metal may be chosen for compatibility with the downstream panel process flow and could be Al, Ti, TiN, Ta, TaN, etc. Further, the top metal contact layer 802 can optionally be covered by a dielectric layer, such as an atomic layer deposition (ALD) layer (e.g. $Al_2O_3$) to protect the metal layer from possible attack during a subsequent release operation (e.g. vapor HF). In addition, a dielectric layer covering the metal contact layer 802 can help where transfer is accomplished using an electrostatic transfer head.

Referring to FIG. 41, at operation 3912, trenches 801 are formed through the build-up structure 290 and into the device layer 220 of the device substrate 210. An optional dielectric layer, such as ALD $Al_2O_3$ may optionally be formed along the trench 801 sidewalls, for example, for etch selectivity during a subsequent release operation. In some embodiments, an optional operation 3914 is performed to fill the trenches with a sacrificial trench fill 806 (e.g. $SiO_2$) at this stage. The build-up structure 290 side of the device substrate 210 is then bonded to a carrier substrate 812 at operation 3916. As illustrated in FIG. 42 bonding may be facilitated using an adhesive layer 810. In an embodiment, nubs 807 of the sacrificial trench fill 806 are embedded in the adhesive layer 810.

The bulk substrate 201 may then be removed at operation 3918 to expose a back side of the device substrate 210. This may be accompanied by wafer thinning and grinding to expose the trenches 801. At this stage stabilization pads 820 may be formed on the thinned surface. The stabilization pads 820 may be formed of a metal to control adhesion with the stabilization posts to be formed. In an embodiment, stabilization pads 820 are metal, such as copper or aluminum. Sacrificial layer 830 may then be formed on the device layer 220, and patterned to form post openings 832 over the stabilization pads 820 at operation 3920. In an embodiment, sacrificial layer 830 is formed of the same material as sacrificial trench fill 806 (e.g. $SiO_2$).

Figure 45:
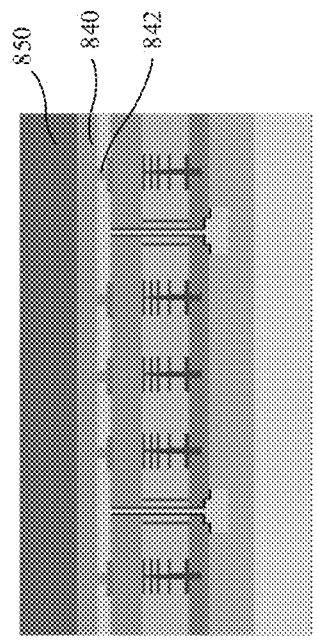
FIG. 45 is a schematic cross-sectional side view illustration of the formation of a backside stabilization structure in accordance with an embodiment.
Figure 46:
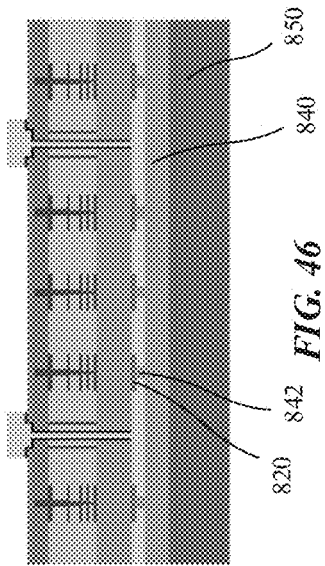
FIG. 46 is a schematic cross-sectional side view illustration of the patterned device wafer after de-bonding from carrier substrate in accordance with an embodiment.
Figure 47:
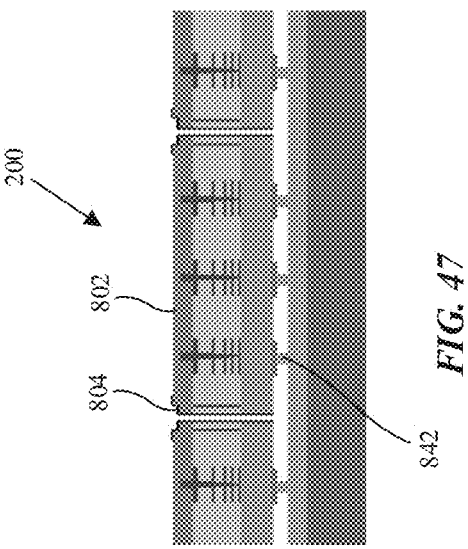
FIG. 47 is a schematic cross-sectional side view illustration of a plurality of stabilized pixel driver chips after removal of the sacrificial release layers in accordance with an embodiment.

Referring to FIG. 45, a stabilization structure is then formed on the back side of the device substrate 210 at operation 3922. As shown, the stabilization structure may include a stabilization layer 840, which also includes stabilization posts 842. In an embodiment, stabilization layer 840 is formed of a metal or polymer such as benzocyclobutene (BCB). The stabilization structure may additionally include a support substrate 850, which can also function as a permanent carrier substrate. Support substrate 850 may be rigid. Moving to FIG. 46, the carrier substrate may be removed at operation 3924. In an embodiment, this is accomplished using a laser ablation technique, and wet cleaning to remove the adhesive layer. The backside patterned sacrificial layer 830 is then removed during release operation 3926 resulting in the array of pixel driver chips 200 supported by a plurality of support posts 842. In accordance with embodiments, the sacrificial trench fill 806 is also removed during this operation, for example, using a vapor HF etching technique.

Figure 48:
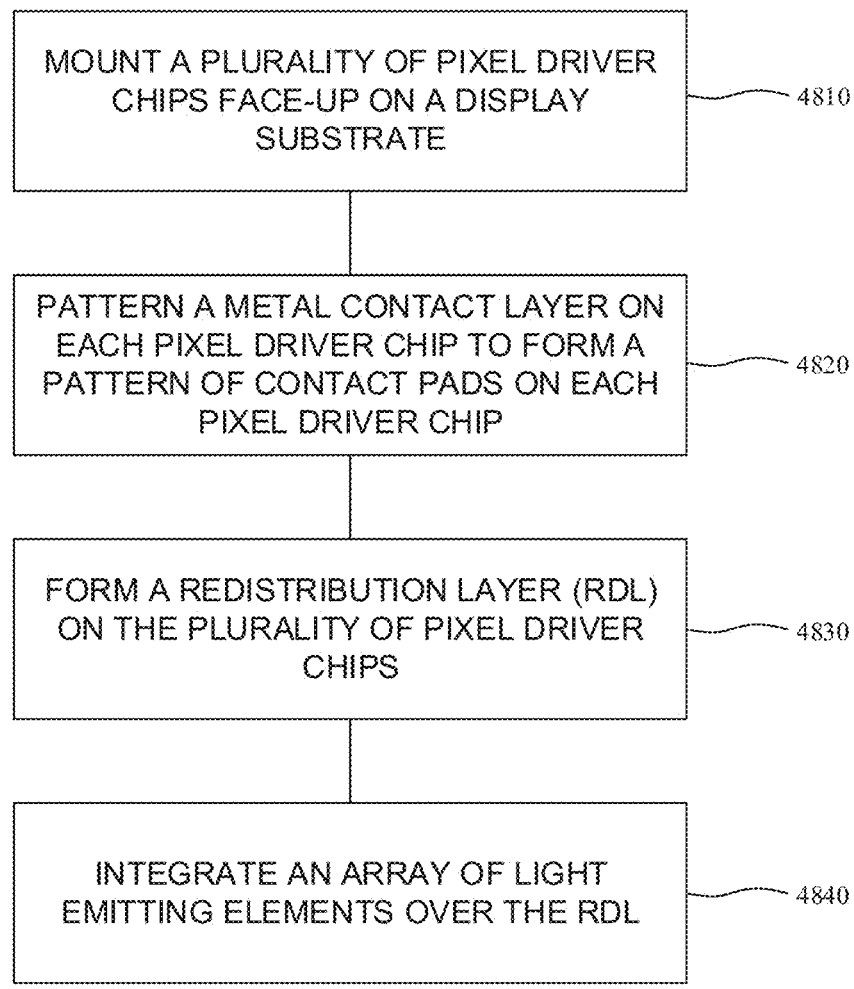
FIG. 48 is an illustration of a method of forming a display panel in accordance with an embodiment.
Figure 49A:
FIG. 49A is a schematic cross-sectional side view illustration of an adhesive layer formed over a display substrate in accordance with an embodiment.
Figure 49B:
FIG. 49B is a schematic cross-sectional side view illustration of an array of pixel driver chips transferred face up to a display substrate in accordance with an embodiment.

Turning now to FIG. 48 a method of forming a display panel is provided in accordance with an embodiment. In interest of conciseness and clarity, the following description of FIG. 48 is jointly made with regard to the schematic cross-sectional side view illustrations of FIGS. 49A-49J. FIG. 49A is a schematic cross-sectional side view illustration of an adhesive layer 702 formed over a display substrate 710 in accordance with an embodiment. Display substrate 710 may be a variety of rigid or flexible substrates, and may include one or more layers. In an embodiment display substrate 710 is a glass or polymer panel. In the particular embodiment illustrated, the display substrate includes a rigid support substrate 705, such as glass, and a flexible substrate 701, such as polyimide, PEN or PET, that can be removed from the support substrate 705 in the final display panel 100 product. In some embodiments, a metal layer is formed and patterned to form registration (alignment) marks 703 to facilitate lithographic alignment and transfer tool alignment. Exemplary materials for adhesive layer 702 include polymers, solders, etc. In an embodiment, adhesive layer is partially cured (e.g. B-staged). An exemplary material includes BCB. In another embodiment the adhesive layer 702 is patterned such that the adhesive layer is only present in the areas of the pixel driver chips 200. At operation 4810 a plurality of pixel driver chips 200 are mounted face-up on the display substrate 710 as illustrated in FIG. 49B. Each pixel driver chip 200 may include a plurality of contact vias 295 and a continuous top metal contact layer 802 on and in electrical contact with all of the plurality of contact vias 295. Mounting may be facilitated by adhesive layer 702, which may then be cured.

Figure 49C:
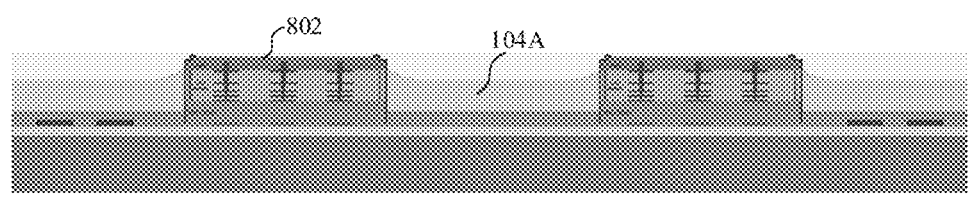
FIG. 49C is a schematic cross-sectional side view illustration of a first insulator overcoat and etch-back in accordance with an embodiment.

A first insulator layer 104A may then be formed over the plurality of mounted pixel driver chips 200, and (e.g. locally) etched back to expose the metal contact layers 802 as illustrated in FIG. 49C. At operation 4820 the metal contact layers are patterned to form a pattern of contact pads 255 on each pixel driver chip 200. Specifically the contact pads 255 may be aligned over the contact vias 295. In some embodiments, the optional dielectric layer (e.g. ALD) covering the metal contact layers 802 is first patterned, or alternatively patterned during the same process as the metal patterning. As described, the optional dielectric layer can aid in transfer of the pixel driver chips 200, for example, when being transferred using an electrostatic transfer technique. In such a process, the dielectric layer may facilitate the creation of an electric field to create the required pick up pressure. In addition, the optional dielectric layer may provide mechanical and chemical protection during the transfer process, as well as during etch back of the first insulator layer 104A. In an embodiment, the patterned dielectric layer shares the same pattern as the contact pads 255.

Figure 49D:
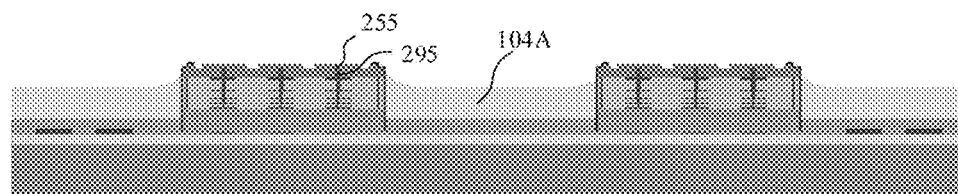
FIG. 49D is a schematic cross-sectional side view illustration of patterned contact pads in accordance with an embodiment.

Still referring to FIG. 49D, patterning of the metal contact layers 802 to form contact pads 255 may be performed in a panel level process flow. Thus, the contact pads 255 are aligned with panel registration marks 703 rather than directly with each individual pixel driver chip 200. By patterning the pixel driver chip top metal layer in the panel level process flow, the transfer operation 4810 illustrated in FIG. 49B may have more misalignment tolerance. Thus, the contact vias 295 in the pixel driver chips 200 that connect the contact pads 255 to the inner metal layers in the build-up structures can be as small as the feature size of the technology (e.g. 55 nm, 40 nm), but may be larger (e.g. 0.5 µm, 1 µm), such that it has a high yield rate and low resistivity. Detection of the use of this feature is possible as there can be a clear pattern of pixel driver chip 200 and contact via 295 misalignment with respect to the top contact pads 255 that can be attributed to the transfer tolerance of the pixel driver chips 200. In case of the use of an electrostatic micro device transfer assembly or a multi-nozzle pick and place tool this misalignment may be the same or at least similar for a local group (e.g. batch) of pixel driver chips, as they all have been transferred at the same time (e.g. the panel includes multiple batches of transferred pixel driver chips). Separate batches may have been transferred from a separate carrier substrate, or different locations within a same carrier substrate. In case of a single die pick and place process every pixel driver chip has its own misplacement that can be traced back to a typical pick and place machine tolerance.

Figure 49E:
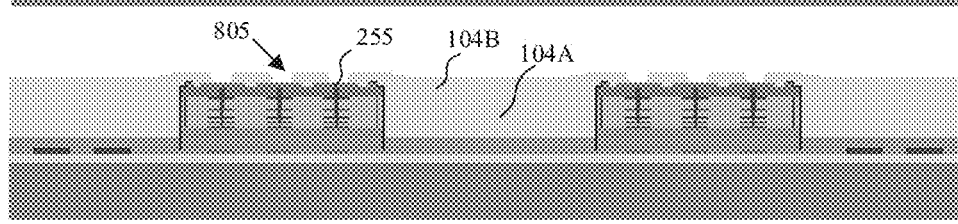
FIG. 49E is a schematic cross-sectional side view illustration of the a patterned insulator layer to expose the patterned contact pads in accordance with an embodiment.
Figure 49F:
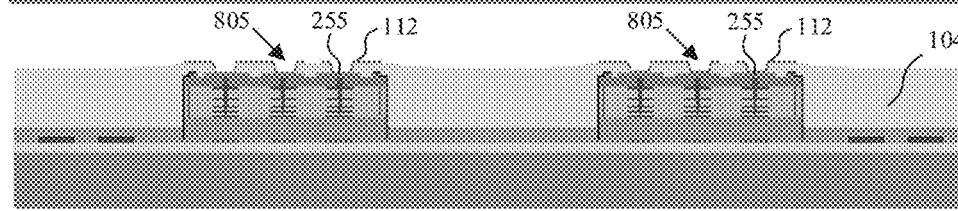
FIG. 49F is a schematic cross-sectional side view illustration of the formation of first redistribution lines in accordance with embodiments.

Referring now to FIG. 49E, a second insulator layer 104B may then be formed over the pixel driver chips 200, and patterned to form openings 805 exposing the contact pads 255. First and second insulator layers 104A, 104B together may form insulator layer 104. An RDL is then formed on the plurality of pixel driver chips 200 at operation 4830. In the particular embodiments illustrated in FIGS. 49F-49G, a front side RDL 110 including redistribution lines 112 and dielectric layers 114 is formed using a layer-by-layer process. Redistribution lines 112 may be formed directly on the contact pads 255. This removes the need for a specific bonding step for the pixel driver chip contacts.

Figure 49G:
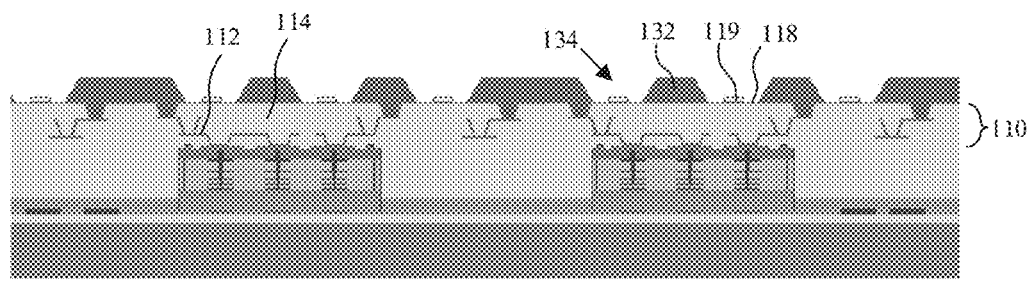
FIG. 49G is a schematic cross-sectional side view illustration of a front side RDL and patterned bank layer in accordance with an embodiment.
Figure 49H:
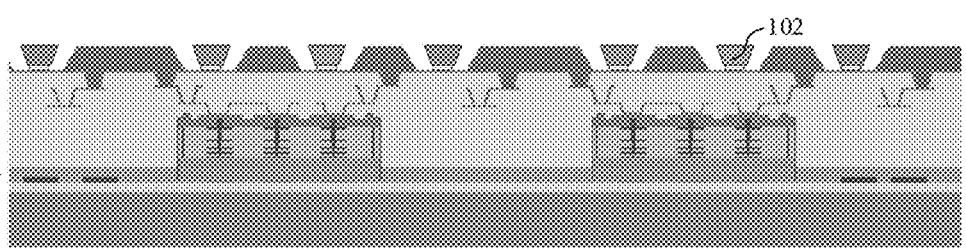
FIG. 49H is a schematic cross-sectional side view illustration of transferred LEDs to the front side RDL in accordance with an embodiment.
Figure 49I:
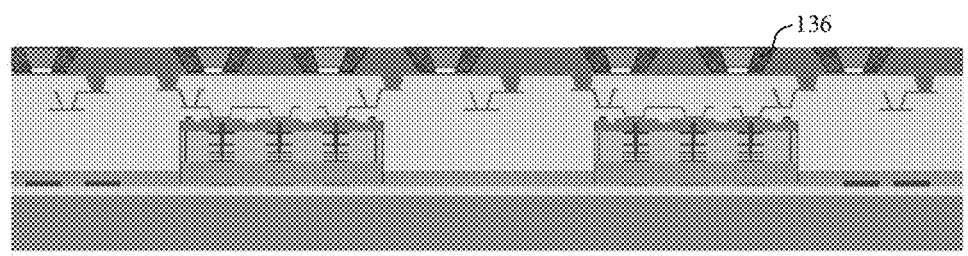
FIG. 49I is a schematic cross-sectional side view illustration of the application of a diffuser fill around the LEDs in accordance with an embodiment.

As shown in FIG. 49G, formation front side RDL may include the formation of contact pads 118 on a front side of the front side RDL 110. Additionally, an insulating bank layer 132 may then be formed and patterned to create a pattern of bank openings 134 exposing the contact pads 118. Bank openings 134 may optionally be lined with a reflective coating, such as a thin gold, silver, or aluminum layer, etc. Solder posts 119 (e.g., indium) may optionally be formed on the contacts pads 118 to facilitate subsequent bonding the LEDs 102 to the contact pads 118.

Figure 49J:
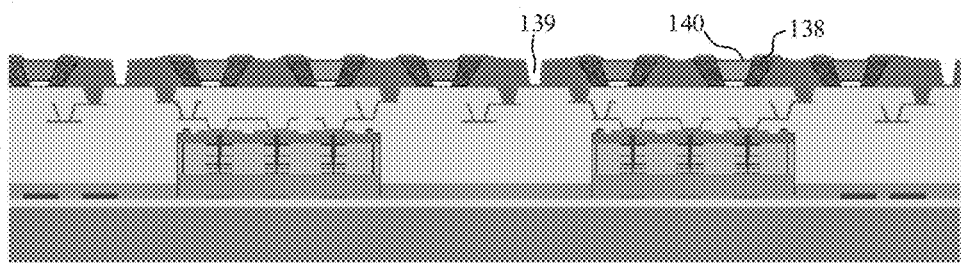
FIG. 49J is a schematic cross-sectional side view illustration of the formation of a top conductive contact layer over the array of LEDs in accordance with an embodiment.

An array of light emitting elements are then integrated over the RDL at operation 4840. In the particular embodiment illustrated in FIG. 49H, a plurality of inorganic semiconductor-based micro LEDs are integrated, though embodiments are compatible with other types of light emitting elements such as OLED, quantum dot (QD), LCD or electronic ink (E Ink). In the particular embodiment illustrated in FIG. 49H, a plurality of micro LEDs 102 are bonded to the contact pads 118 with aid of the solder posts 119. Following mounting of the LEDs 102, an optional diffuser fill 136 may be formed around the LEDs 102, and within the bank openings 134. For example, diffuser fill 136 may include a polymer matrix with particle fillers, such as $TiO_2$, to scatter light emitted from the LEDs 102. Referring now to FIG. 49J, additional processing may be performed to complete the LED integration. For example, a top passivation layer 138 may be formed and patterned to device contact openings above the LEDs 102. Additionally, vias 139 may be formed through the bank layer 132 (or already be formed) to expose second electrode terminals (e.g. ground, low voltage contacts ($V_{SS}$), etc.). One or more top conductive contact layers 140 may then be formed over one or more, or all of the LEDs 102. The top conductive contact layer(s) 140 may additionally be formed within vias 139 to contact the second electrode terminals for the LEDs 102. Also, a final black matrix layer may be processed on top of the stack to minimize ambient light reflection.

Figure 50A:
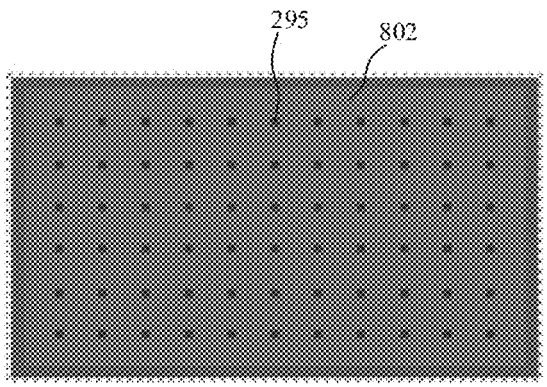
FIG. 50A is a schematic top view illustration of a plurality of pixel driver chip contact vias underneath a metal contact layer in accordance with an embodiment.

Referring now to FIG. 50A, a schematic top view illustration is provided of a plurality of pixel driver chip contact vias 295 underneath a metal contact layer 802 for a single pixel driver chip in accordance with an embodiment. For example, this may correspond to the state of the pixel driver chip 200 in FIG. 49C prior to the formation of the metal contacts at operation 4820, and illustrated in FIG. 49D. As shown, the metal contact layer 802 may be a continuous layer over, and completely cover the contact vias 295. Thus, the metal contact layer 802 may completely cover the whole pixel driver chip 200 top surface, except there can be a small edge area (e.g. 1 or 2 µm) without the metal contact layer (e.g. exclusion zone).

Figure 50B:
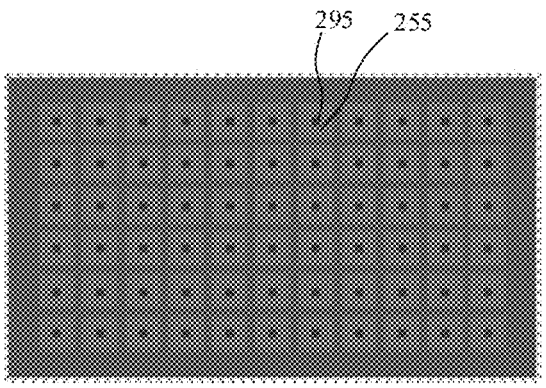
FIG. 50B is a schematic top view illustration of a plurality of pixel driver chip contact vias underneath a plurality of aligned patterned contact pads in accordance with an embodiment.
Figure 50C:
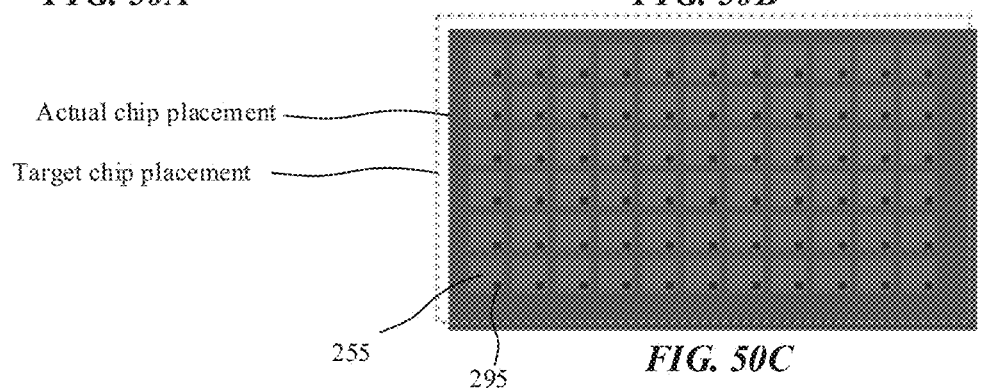
FIG. 50C is a schematic top view illustration of a plurality of pixel driver chip contact vias underneath a plurality of offset patterned contact pads in accordance with an embodiment.

FIGS. 50B and 50C provide two schematic top view illustrations of patterned contact pads 255 aligned (FIG. 50B) with the underlying contact vias 295, or offset (FIG. 50C) from the underlying contact vias 295. In the embodiments illustrated, a single contact pad 255 is connected to a single contact via 295, however, a single contact pad 255 may be connected to multiple contact vias 295, for example, to lower resistance. In accordance with some embodiments, a standard deviation is utilized to provide location tolerances for components on the panel. Specifically, when standard deviations of processes are compared in this disclosure, the comparison is meant for a same number of (e.g. first, second, third, etc.) standard deviation. For example, the general statistic shorthand 68-95-99.7 rule is used to allocate the percentage of values that lie within one, two, and three standard deviations of the mean, respectively. By way of example, standard semiconductor manufacturing techniques used for the fabrication of the pixel driver chips 200 can align metal patterns with contact vias 295 within 0.05 µm, or even within 0.01 um at 3 sigma (three standard deviations). If contact pads 255 were formed at the wafer scale during formation of the pixel driver chips 200, alignment may be expected as illustrated in FIG. 50B, for example, where geometric centers (e.g. centroids) of the contact pads 255 are aligned with the geometric centers of the contact vias 295 within 0.05 µm, or even within 0.01 um at 3 sigma.

In accordance with embodiments, when the pixel driver chips 200 are transferred to the display substrate, such as at operation 4810 they may be positioned with respect to registration (alignment) marks 703 on the display substrate 710. An exemplary typical alignment accuracy of the transfer process may be 5 µm at 3 sigma, and at best 1 µm at 3 sigma. This is one to two orders of magnitude larger than, for example, variation in location of the contact vias 295 across a single pixel driver chip 200, or chip-to-chip for the plurality of pixel driver chips 200 in the display.

As described with regard to operation 4820, the contact metal layers on each pixel driver chip can be patterned at the panel level to form the pattern of contact pads 255 across all of the pixel driver chips 200. This patterning is also done with respect to the registration marks 703 on the display substrate 710, and the alignment accuracy may be determined by the photolithographic tools employed, which may be typically better than 0.05 µm, or even within 0.01 µm. With this method the top metal contact layer 802 of the pixel driver chips 200 is accurately registered to the registration marks 703 on the plate and to the subsequent via contact 295 and metal patterns. The pixel driver chips 200 themselves, however, may still have the much larger position variation (e.g. one to two orders of magnitude larger) related to the accuracy of the transfer process. This may result in an alignment as shown in FIG. 50C where actual pixel driver chip placement is offset from a target pixel driver chip placement location, while location of the contact pads 255 is unchanged. As the via contacts 295 of the pixel driver chips 200 are typically small (smaller than 1 µm, even as small as 0.2 µm) compared to the smallest possible features in the plate processing (typically 5 µm and at best 1 µm) the process in accordance with embodiments may relax (increase) the tolerance budget for placement of the pixel driver chips 200 during the transfer process.

Figure 51:
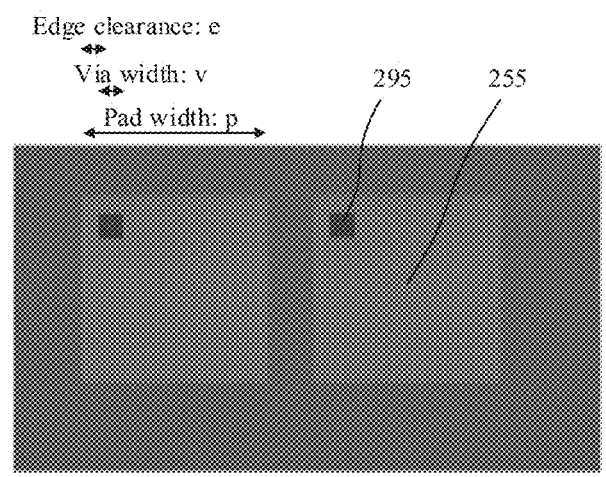
FIG. 51 is a close-up schematic top view illustration of offset patterned contact pads in accordance with an embodiment.

FIG. 51 is a close-up schematic top view illustration of offset patterned contact pads 255 in accordance with an embodiment. In an exemplary implementation, alignment tolerance may be provided by equation (1):

$$\text{Tolerance } t=(p-2*e-v)/2 \qquad (1)$$

where (e) corresponds to edge clearance from via contact 295 edge to contact pad 255 edge, (v) corresponds to via contact 295 width, and (p) corresponds to contact pad 255 width.

Figure 52:
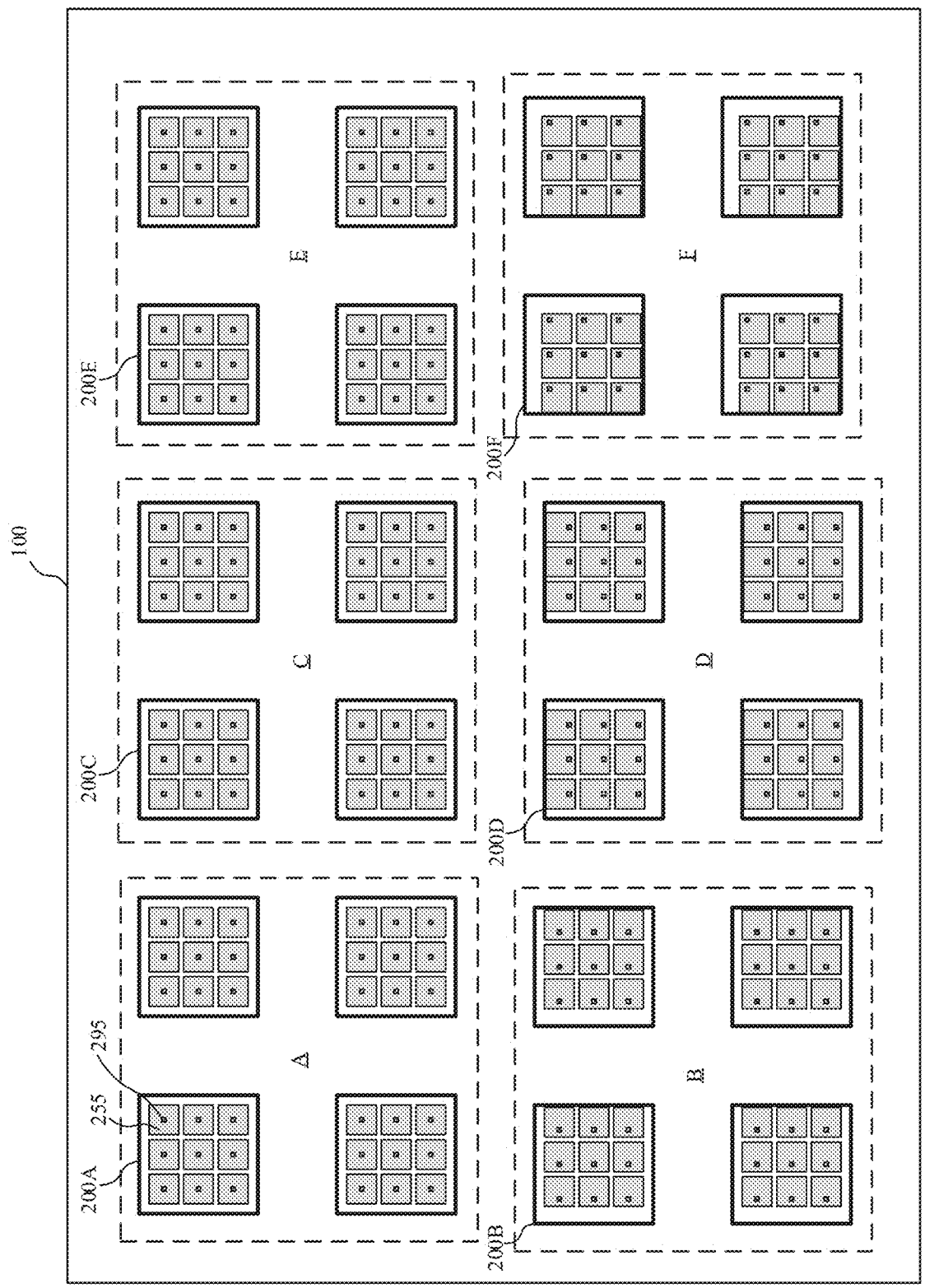
FIG. 52 is a schematic top view illustration of an array of contact pads formed over an array of offset pixel driver chips in accordance with an embodiment.

FIG. 52 is a schematic top view illustration of an array of contact pads 255 formed over an array of offset pixel driver chips 200 for a display panel 100 in accordance with an embodiment. While not drawn to scale, FIG. 52 illustrates several structural correlations in accordance with embodiments. For example, each pixel driver chip 200A-220F may represent a single pixel driver chip 200 transferred in a batch A-F. Thus, within a batch of pixel driver chips 200, each pixel driver chip may have a similar displacement from the overlying contact pads 255. As illustrated in FIG. 52, the position distribution of contact pads 255 is comparatively uniform across the display panel, in that they have similar spacing across the display panel 100 (or display substrate 710). This may be attributed to lithography tolerances. Alignment error, or placement distribution of the pixel driver chips 200 may be more pronounced, due to alignment tolerances of the transfer tools used. By way of illustrated, pixel driver chips 200A, 200C, 200E are shows as being located at their target locations. In comparison, the pixel driver chips 200B within transfer batch B may be displaced to the left of a target location. Similarly, pixel driver chips 200D may be displaced below a target placement, while pixel driver chips 200F are displaced both above and to the right of a target placement.

Thus, each "batch" of pixel driver chips may be characterized by its own batch displacement, where each pixel driver chip in the corresponding batch has the same displacement across the batch. Illustrated batches A, C, E and associated pixel driver chips 200A, 200C, 200E may have lower "batch" displacements, with batches B, D, F associated with pixel driver chip 200B, 200D, 200F having comparatively higher batch displacements. As illustrated, batches A, C, E may have approximately the same "batch" batch displacement (which is illustrated as negligible), whereas batches B, D, F may have their own characteristic "batch" displacements. For example, batch F associated with pixel driver chip 200F may have the highest "batch" displacement, where maximum x and y location offset is illustrated.

In an embodiment, a display panel includes an array of pixel driver chips 200 embedded in an insulator layer 104, each pixel driver chip 200 including a plurality of contact vias 295 coupled to a plurality of contact pads 255 such that an array of chip contact vias and an array of chip contact pads is distributed across the display panel 100. An array of light emitting elements (e.g. 102) is coupled to the array of pixel driver chips 200, and a placement distribution of the array of pixel driver chips 200 across the display panel 100 is characterized by a standard deviation that is larger than a standard deviation for position distribution of the array of contact pads 255 across the display panel 100. For example, a standard deviation for placement distribution of the array of pixel driver chips 200 may be at least an order of magnitude larger than a standard deviation for position distribution of the array of contact pads 295. As shown in FIG. 52, position distribution of the plurality of contact pads 225 (local, over each pixel driver chip 200) is characterized by the same standard deviation as the position distribution of the array of contact pads across the display panel (global). Additionally, the array of contact vias 295 across the display panel is not uniformly offset from the array of contact pads 255 across the display panel. However, the plurality of contact vias 295 may be uniformly distributed chip to chip within a batch, with uniform offset from the local pluralities of contact pads 255. These characterizations may be attributed to the pixel driver chip batch locations "floating" underneath the pattern of contact pads 255 across the display panel 100. In an embodiment, the standard deviation for placement distribution of the array of pixel driver chips 200 across the display panel 100 is greater than 1 µm, and the standard deviation for position distribution of the array of contact pads 295 across the display panel 100 is less than 0.05 µm. In an embodiment, the array of pixel driver chips 200 includes a plurality of batches of pixel driver chips 200, wherein each batch of pixel driver chips 200 includes multiple pixel driver chips, and multiple batches in the plurality of batches are characterized by a different batch displacement from the corresponding plurality of contact pads 295.

Embodiments are applicable to a variety of arrangements, including those where the array of pixel driver chips 200 is face down on a back side redistribution layer (RDL) 120, and the array of light emitting elements (e.g. 102) is above the array of pixel driver chips; where the array of pixel driver chips 200 is face up, a front side RDL 110 is formed over and on the array of pixel driver chips, and the array of light emitting elements (e.g. 102) is above the front side RDL 110; and pixel driver chips 200 with both top and bottom contact pads. In accordance with embodiments, the RDLs include redistribution lines 112 formed directly on the array of contact pads 255.

In yet another aspect, while the above embodiments have been described with regard to pixel driver chips for integration in display panels, the processing sequences are not so limited, and may be applied to a variety of general packaging solutions. In an embodiment, a packaging method includes mounting a plurality of chips face-up on a substrate, where each chip includes a plurality of contact vias and a continuous top metal contact layer on and in electrical contact with all of the plurality of contact vias, patterning the metal contact layers of the plurality of chips to form a pattern of contact pads on each chip, and forming a redistribution layer (RDL) on the plurality of chips. Additionally, it is not necessary to have merely a single metal contact layer, and multiple metal contact layers can alternatively be present at the time of mounting, followed by fine-patterning of the contact pads after mounting. Likewise, it is not necessary to form an RDL on the patterned contact pads, and instead other manners for making electrical connections can be employed. Thus, the concept of mounting a chip with a rough metal pattern, followed by fine patterning to form contact pads can be implemented in various different manners.

Figures 53, 54, 55:
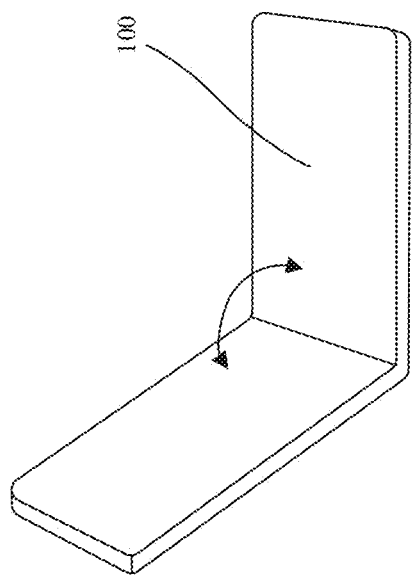
FIG. 53 is a side view illustration of a curved or flexible display panel in accordance with an embodiment.
FIG. 54 is an isometric view illustration of a foldable display panel in accordance with an embodiment.
FIG. 55 is a top view illustration of a plurality of display panel tiles, arranged side-by-side in accordance with an embodiment.

The display panels in accordance with embodiments may be rigid, curved, rollable, foldable, or otherwise flexible. For example, FIG. 53 is a side view illustration of a curved or flexible display panel 100. FIG. 54 is an isometric view illustration of a foldable display panel 100 in accordance with an embodiment. FIG. 55 is a top view illustration of a plurality of display panel 100 tiles, arranged side-by-side. In such a configuration, the tiles may be used together to form a larger screen or display area. In one aspect, this may be facilitated by the increased display area on the front surface of the display panel 100 that is possible in accordance with embodiments.

Figure 56:
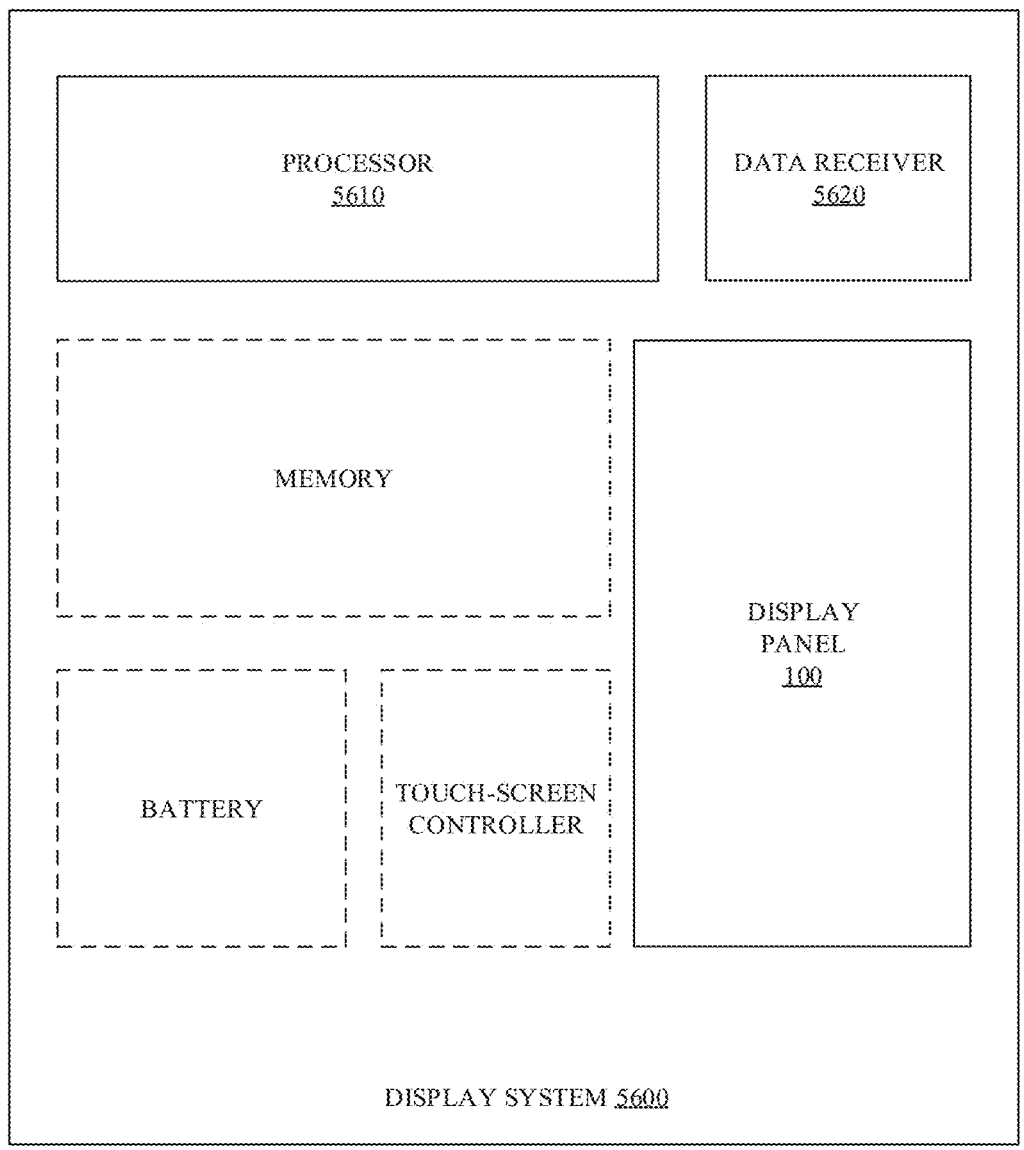
FIG. 56 is a schematic illustration of a display system in accordance with an embodiment.

FIG. 56 illustrates a display system 5600 in accordance with an embodiment. The display system houses a processor 5610, data receiver 5620, a one or more display panels 100 which may include one or more display driver ICs such as scan driver ICs and data driver ICs. The data receiver 5620 may be configured to receive data wirelessly or wired. Wireless may be implemented in any of a number of wireless standards or protocols.

Depending on its applications, the display system 5600 may include other components. These other components include, but are not limited to, memory, a touch-screen controller, and a battery. In various implementations, the display system 5600 may be a wearable, television, tablet, phone, laptop, computer monitor, kiosk, digital camera, handheld game console, media display, ebook display, or large area signage display.

In utilizing the various aspects of the embodiments, it would become apparent to one skilled in the art that combinations or variations of the above embodiments are possible for fabricating a display panel. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display panel comprising:
a display substrate;
an array of pixel driver chips over a corresponding array of alignment marks on the display substrate, wherein the array of pixel driver chips is embedded in an insulator layer, each pixel driver chip comprising a plurality of contact vias coupled to a plurality of contact pads, such that an array of contact vias and an array of contact pads is distributed across the display panel;
an array of light emitting elements coupled to the array of pixel driver chips;
wherein placement distribution of the array of pixel driver chips across the display panel is characterized by a first order standard deviation of displacement values of the array of pixel driver chips to the corresponding array of alignment marks, and position distribution of the array of contact pads across the display panel is characterized by a first order standard deviation of displacement values of the array of contact pads to the corresponding array of alignment marks, and the first order standard deviation for the placement distribution of the array of pixel diver chips across the display panel is larger than the first order standard deviation for the position distribution of the array of contact pads across the display panel.

2. The display panel of claim 1, wherein the first order standard deviation of the placement distribution of the array of pixel driver chips is at least an order of magnitude larger than the first order standard deviation of the position distribution of the array of contact pads.

3. The display panel of claim 1, wherein position distribution of the plurality of contact pads for each pixel driver chip is characterized by the same first order standard deviation as the position distribution of the array of contact pads across the display panel.

4. The display panel of claim 3, wherein the array of contact vias across the display panel is not uniformly offset from the array of contact pads across the display panel.

5. The display panel of claim 1, wherein the plurality of contact vias are uniformly distributed chip to chip.

6. The display panel of claim 1, wherein the array of pixel driver chips is face down on a back side redistribution layer (RDL), and the array of light emitting elements is above the array of pixel driver chips.

7. The display panel of claim 1, wherein the array of pixel driver chips is face up, a front side RDL is formed over and on the array of pixel driver chips, and the array of light emitting elements is above the front side RDL.

8. The display panel from claim 1, further comprising a plurality of redistribution lines from an RDL formed directly on the array of contact pads.

9. The display panel of claim 1, wherein the array of pixel driver chips comprises a plurality of batches of pixel driver chips, wherein each batch of pixel driver chips includes multiple pixel driver chips, and multiple batches in the plurality of batches are characterized by a different batch displacement from the corresponding plurality of contact pads.

10. The display panel of claim 9, wherein each batch in the plurality of batches of pixel driver chips contains a same number of pixel driver chips.

* * * * *